United States Patent
Zhu et al.

(10) Patent No.: US 11,626,424 B2
(45) Date of Patent: *Apr. 11, 2023

(54) SEMICONDUCTOR DEVICES AND METHODS OF FABRICATION

(71) Applicant: Micron Technology, Inc., Boise, ID (US)

(72) Inventors: Hongbin Zhu, Boise, ID (US); Zhenyu Lu, Boise, ID (US); Gordon Haller, Boise, ID (US); Jie Sun, Boise, ID (US); Randy J. Koval, Boise, ID (US); John Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/397,338

(22) Filed: Aug. 9, 2021

(65) Prior Publication Data

US 2021/0366931 A1 Nov. 25, 2021

Related U.S. Application Data

(60) Continuation of application No. 16/834,291, filed on Mar. 30, 2020, now Pat. No. 11,088,168, which is a
(Continued)

(51) Int. Cl.
*H01L 27/11582* (2017.01)
*H01L 27/11556* (2017.01)
(Continued)

(52) U.S. Cl.
CPC .... *H01L 27/11582* (2013.01); *H01L 27/1157* (2013.01); *H01L 27/11556* (2013.01);
(Continued)

(58) Field of Classification Search
CPC ......... H01L 27/11556; H01L 27/11563; H01L 27/1157; H01L 27/1158; H01L 27/11582;
(Continued)

(56) References Cited

U.S. PATENT DOCUMENTS

| 8,969,940 B1 | 3/2015 | Yater et al. |
| 9,236,396 B1 | 1/2016 | Koka et al. |

(Continued)

FOREIGN PATENT DOCUMENTS

| CN | 110678987 A | 1/2020 |
| TW | 201820431 A | 6/2018 |

(Continued)

OTHER PUBLICATIONS

"International Application Serial No. PCT/US2017/056956, International Preliminary Report on Patentability dated May 2, 2019", 13 pgs.

(Continued)

*Primary Examiner* — Cheung Lee
(74) *Attorney, Agent, or Firm* — Schwegman Lundberg & Woessner, P.A.

(57) ABSTRACT

Some embodiments include a semiconductor device having a stack structure including a source comprising polysilicon, an etch stop of oxide on the source, a select gate source on the etch stop, a charge storage structure over the select gate source, and a select gate drain over the charge storage structure. The semiconductor device may further include an opening extending vertically into the stack structure to a level adjacent to the source. A channel comprising polysilicon may be formed on a side surface and a bottom surface of the opening. The channel may contact the source at a lower portion of the opening, and may be laterally separated from the charge storage structure by a tunnel oxide. A width
(Continued)

of the channel adjacent to the select gate source is greater than a width of the channel adjacent to the select gate drain.

20 Claims, 31 Drawing Sheets

Related U.S. Application Data division of application No. 16/028,111, filed on Jul. 5, 2018, now Pat. No. 10,608,004, which is a division of application No. 15/296,858, filed on Oct. 18, 2016, now Pat. No. 10,038,002.

(51) Int. Cl.

| | |
|---|---|
| *H01L 29/10* | (2006.01) |
| *H01L 29/51* | (2006.01) |
| *H01L 27/1157* | (2017.01) |
| *H01L 21/28* | (2006.01) |
| *H01L 29/66* | (2006.01) |
| *H01L 29/792* | (2006.01) |
| *H01L 27/11563* | (2017.01) |

(52) U.S. Cl.
CPC .... *H01L 27/11563* (2013.01); *H01L 29/1037* (2013.01); *H01L 29/40114* (2019.08); *H01L 29/513* (2013.01); *H01L 29/66825* (2013.01); *H01L 29/66833* (2013.01); *H01L 29/7926* (2013.01)

(58) Field of Classification Search
CPC ........... H01L 29/1037; H01L 29/40114; H01L 29/513; H01L 29/66825; H01L 29/66833; H01L 29/792; H01L 29/7926
See application file for complete search history.

(56) References Cited

U.S. PATENT DOCUMENTS

| | | | |
|---|---|---|---|
| 10,038,002 B2 | 7/2018 | Zhu et al. | |
| 10,608,004 B2 | 3/2020 | Zhu et al. | |
| 11,088,168 B2 * | 8/2021 | Zhu | H01L 29/40114 |
| 2014/0264533 A1 | 9/2014 | Simsek-Ege et al. | |
| 2015/0041879 A1 | 2/2015 | Jayanti et al. | |
| 2015/0123188 A1 | 5/2015 | Lu et al. | |
| 2015/0123189 A1 | 5/2015 | Sun et al. | |
| 2015/0318295 A1 | 11/2015 | Kai et al. | |
| 2015/0371709 A1 | 12/2015 | Kai et al. | |
| 2016/0099323 A1 | 4/2016 | Hopkins | |
| 2018/0108669 A1 | 4/2018 | Zhu et al. | |
| 2018/0315766 A1 | 11/2018 | Zhu et al. | |
| 2019/0088777 A1 | 3/2019 | Lu et al. | |
| 2020/0227427 A1 | 7/2020 | Zhu et al. | |

FOREIGN PATENT DOCUMENTS

| | | |
|---|---|---|
| WO | WO-2015094535 A1 | 6/2015 |
| WO | WO-2018075498 A1 | 4/2018 |

OTHER PUBLICATIONS

"International Application Serial No. PCT/US2017/056956, International Search Report dated Jan. 30, 2018", 3 pgs.
"International Application Serial No. PCT/US2017/056956, Written Opinion dated Jan. 30, 2018", 11 pgs.
"Taiwanese Application Serial No. 106135266, Office Action dated Jun. 5, 2018", w/ Concise Statement of Relevance; w/ English Claims; w/ Translation, 26 pgs.
"Taiwanese Application Serial No. 106135266, Response filed Dec. 5, 2018 to Office Action dated Jun. 5, 2018", w/ English Claims, 60 pgs.
"Taiwanese Application Serial No. 106135266, Translation Filed Dec. 18, 2017", w/English Claims, 116 pgs.
U.S. Appl. No. 15/296,858, Restriction Requirement dated Apr. 28, 2017, 9 pgs.
U.S. Appl. No. 15/296,858, Response filed Jun. 28, 2017 to Restriction Requirement dated Apr. 28, 2017, 10 pgs.
U.S. Appl. No. 15/296,858, Non Final Office Action dated Jul. 12, 2017, 9 pgs.
U.S. Appl. No. 15/296,858, Response filed Nov. 10, 2017 to Non Final Office Action dated Jul. 12, 2017, 14 pgs.
U.S. Appl. No. 15/296,858, Notice of Allowance dated Dec. 11, 2017, 9 pgs.
U.S. Appl. No. 15/296,858, Notice of Allowance dated Mar. 28, 2018, 8 pgs.
U.S. Appl. No. 16/028,111, Restriction Requirement dated Mar. 15, 2019, 9 pgs.
U.S. Appl. No. 16/028,111, Response filed May 15, 2019 to Restriction Requirement dated Mar. 15, 2019, 9 pgs.
U.S. Appl. No. 16/028,111, Non Final Office Action dated May 30, 2019, 11 pgs.
U.S. Appl. No. 16/028,111, Response filed Oct. 30, 2019 to Non-Final Office Action dated May 30, 2019, 13 pgs.
U.S. Appl. No. 16/028,111, Notice of Allowance dated Nov. 21, 2019, 10 pgs.
U.S. Appl. No. 16/028,111, Corrected Notice of Allowability dated Feb. 13, 2020, 3 pgs.
U.S. Appl. No. 16/834,291, Non Final Office Action dated Aug. 3, 2020, 14 pgs.
U.S. Appl. No. 16/834,291, Response filed Nov. 3, 2020 to Non Final Office Action dated Aug. 3, 2020, 10 pgs.
U.S. Appl. No. 16/834,291, Final Office Action dated Nov. 18, 2020, 10 pgs.
U.S. Appl. No. 16/834,291, Response filed Feb. 18, 2021 to Final Office Action dated Nov. 18, 2020, 8 pgs.
U.S. Appl. No. 16/834,291, Advisory Action dated Mar. 2, 2021, 2 pgs.
U.S. Appl. No. 16/834,291, Notice of Allowance dated Apr. 1, 2021, 9 pgs.
"Chinese Application Serial No. 201780064530.4, Office Action dated Oct. 27, 2022", with English translation, 24 pages.

* cited by examiner

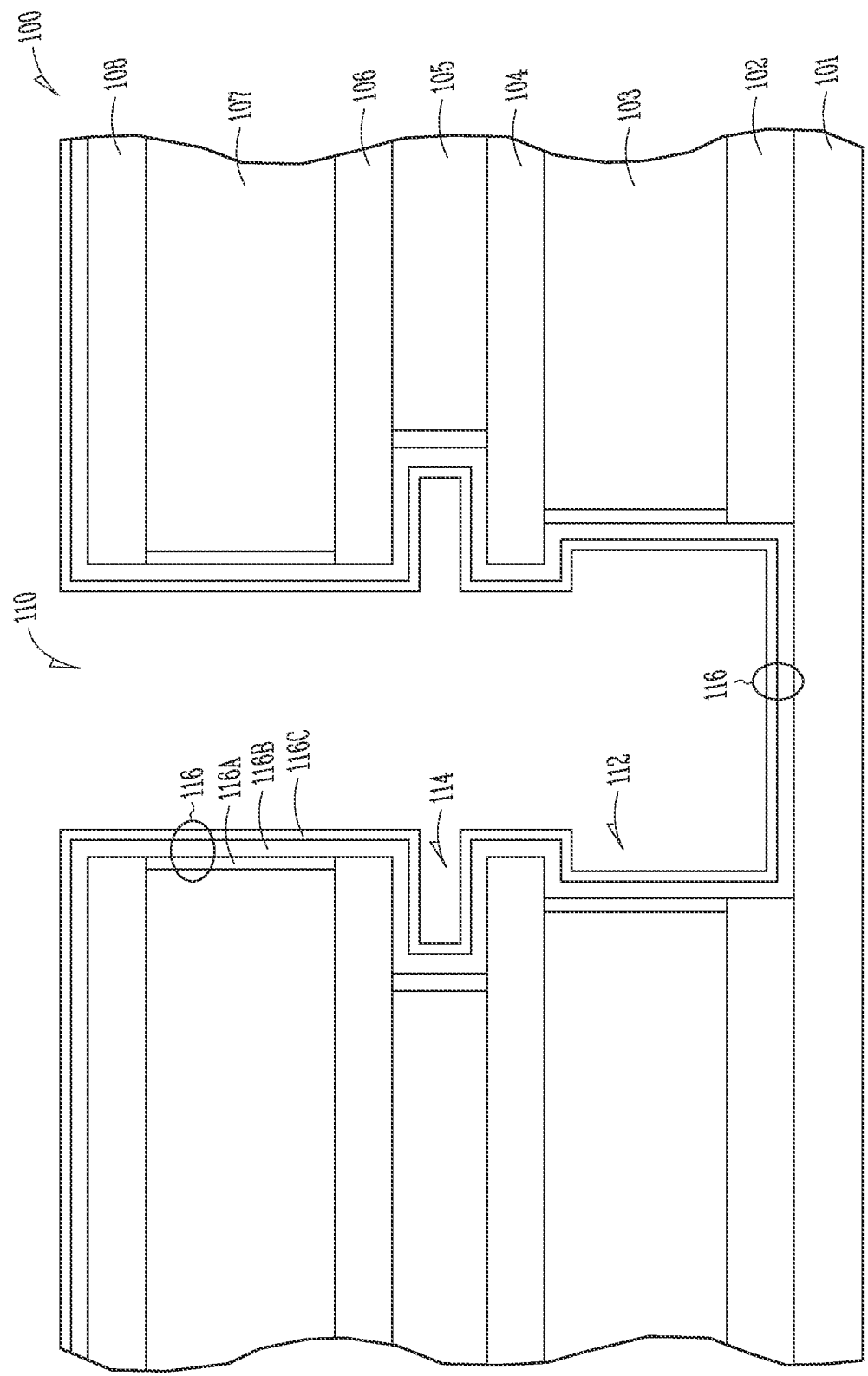

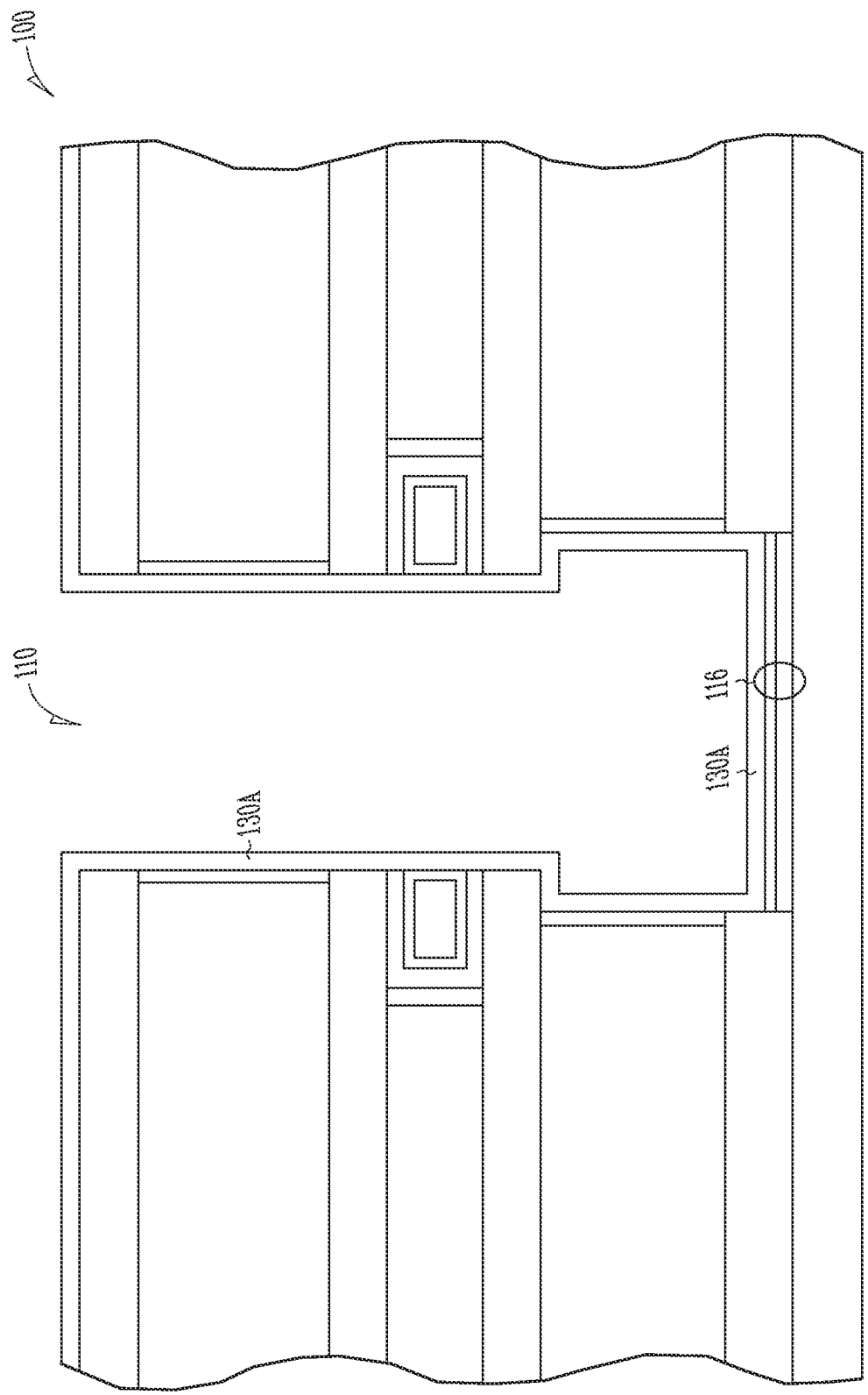

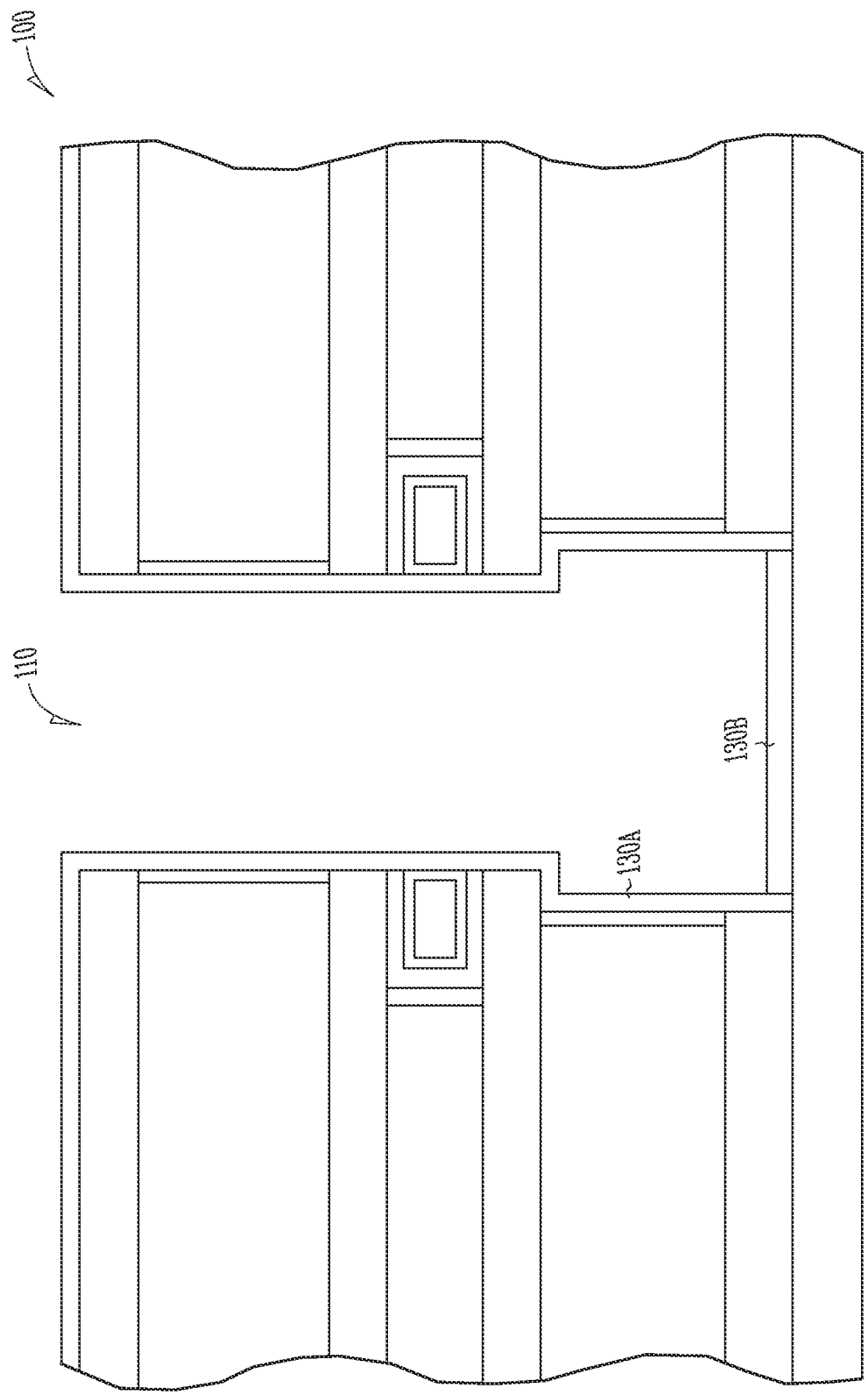

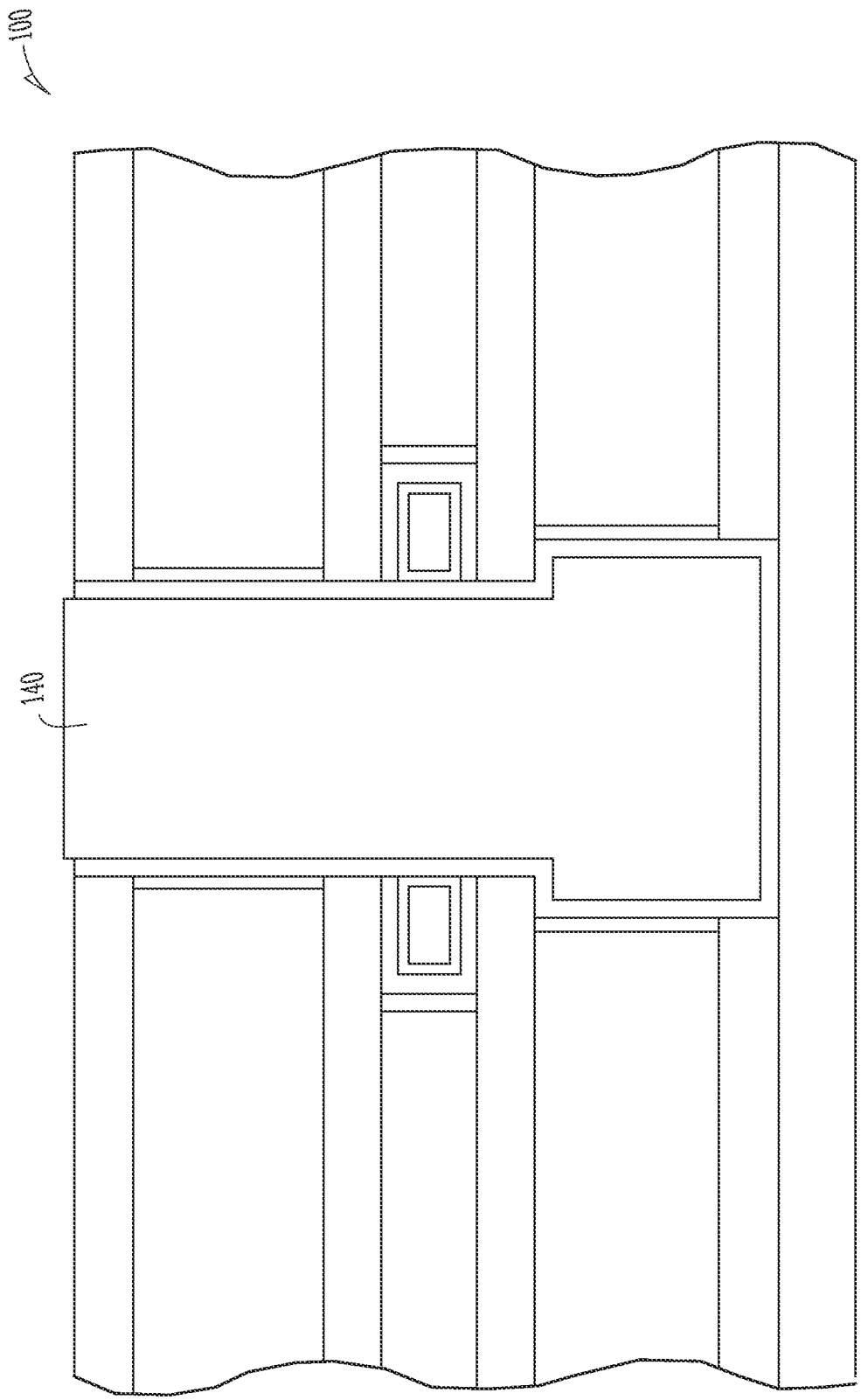

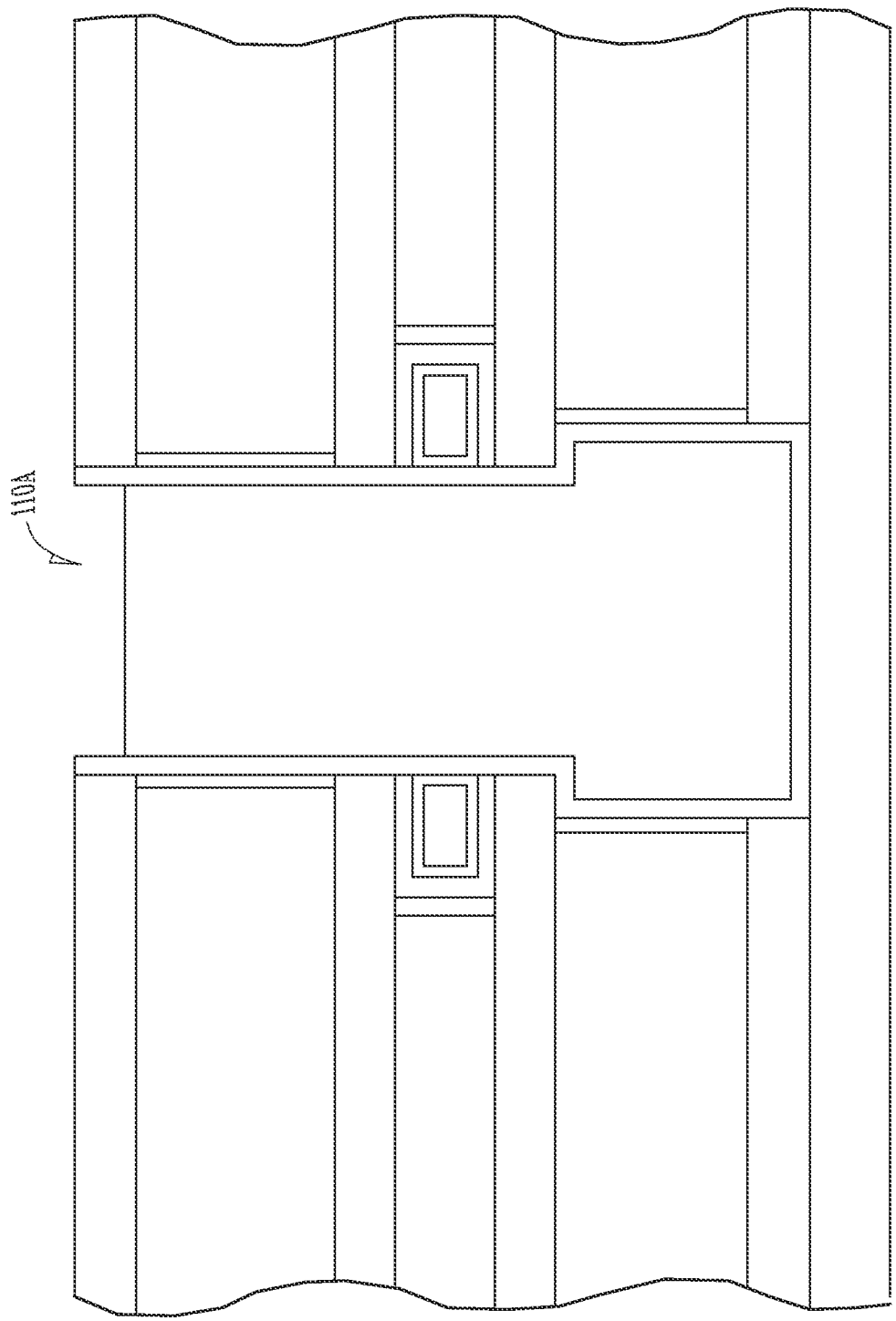

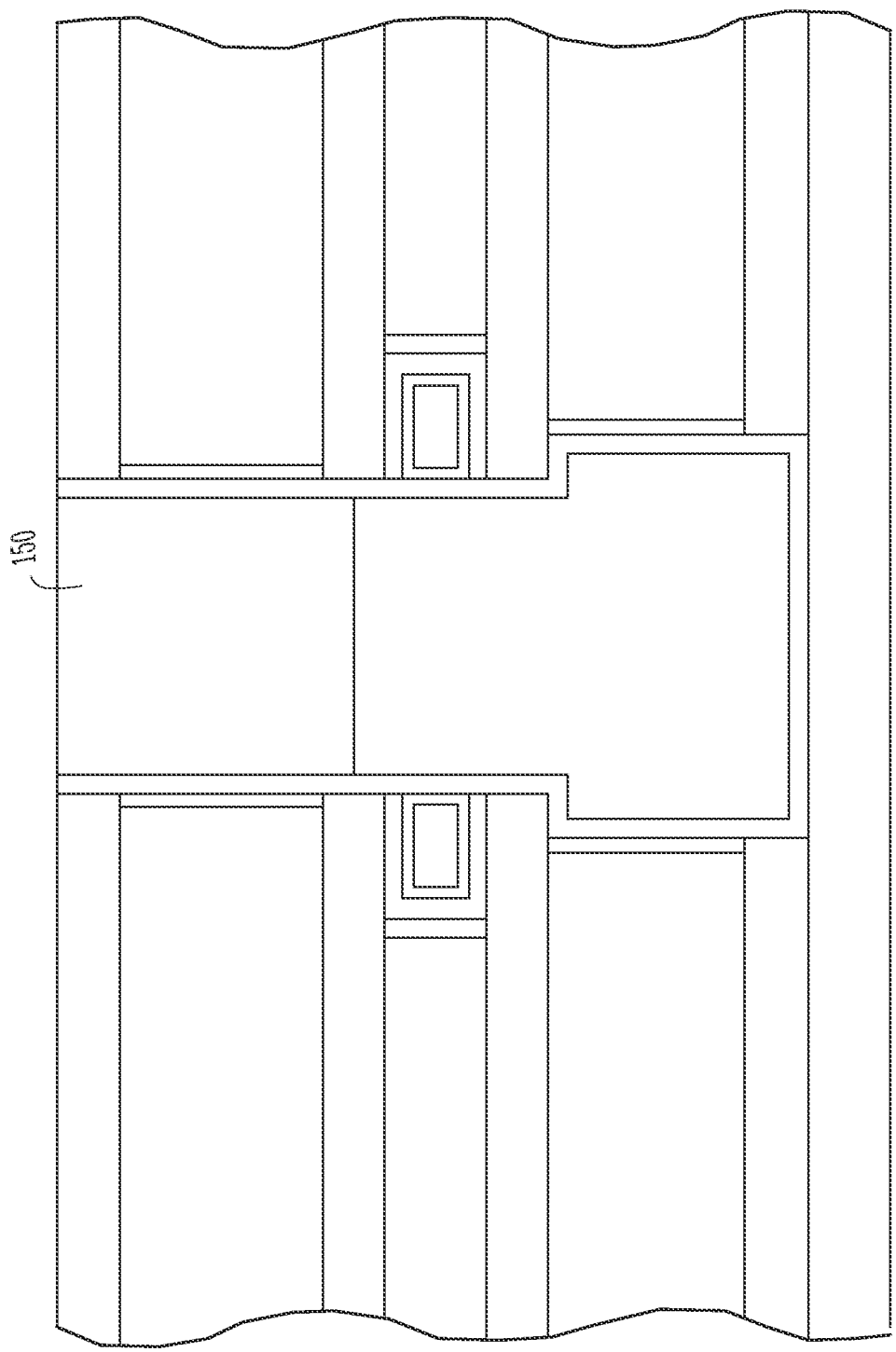

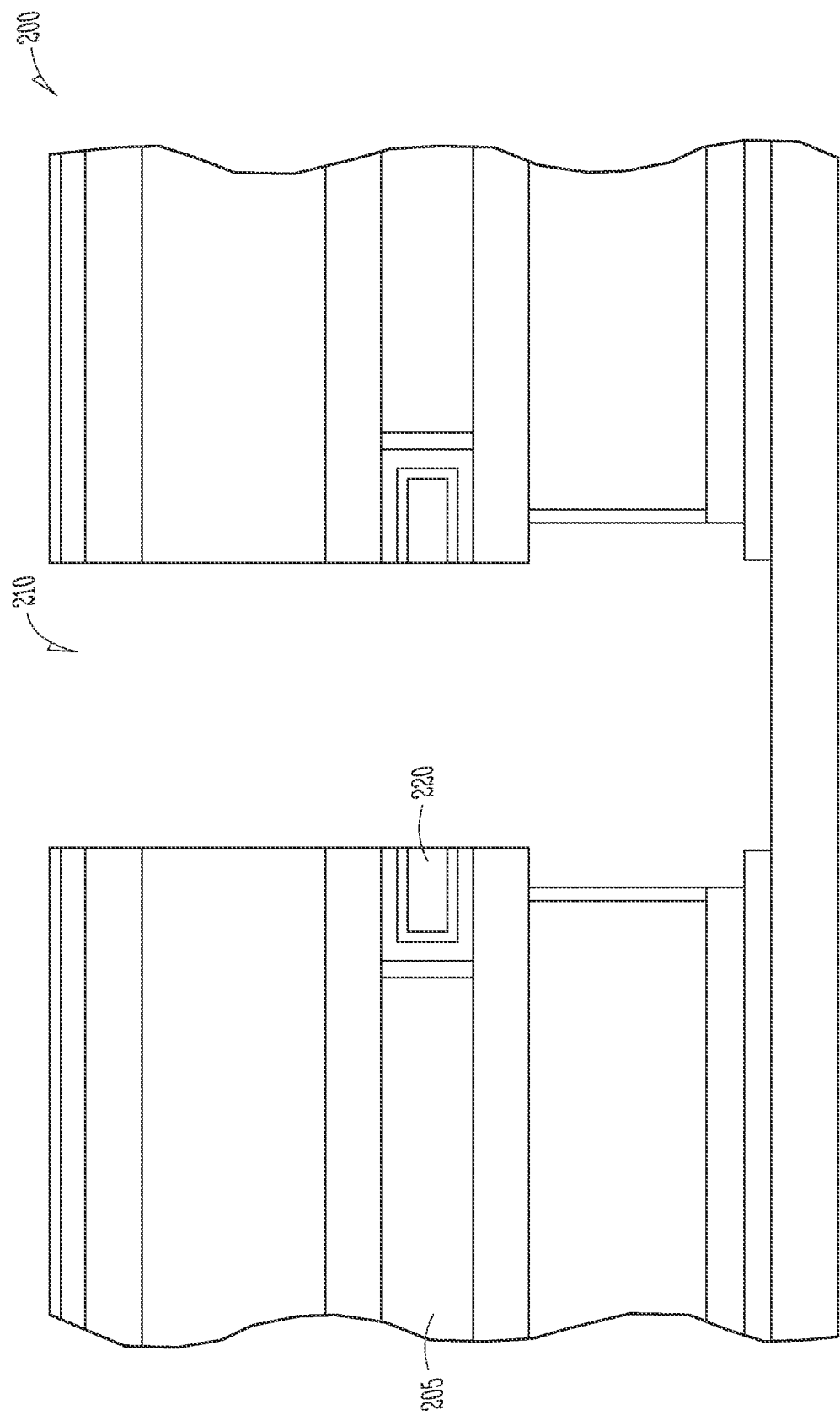

SEMICONDUCTOR DEVICES AND METHODS OF FABRICATION

PRIORITY APPLICATION

This application is a continuation of U.S. application Ser. No. 16/834,291, which is a divisional of U.S. application Ser. No. 16/028,111, filed Jul. 5, 2018, now issued as U.S. Pat. No. 10,608,004, which is a divisional of U.S. application Ser. No. 15/296,858, filed Oct. 18, 2016, now issued as U.S. Pat. No. 10,038,002, all of which are incorporated herein by reference in their entirety.

BACKGROUND

With the development of the semiconductor industry, three-dimensional (3D) semiconductor devices are widely explored. However, the structures of the 3D semiconductor devices that include stacked tiers (e.g., layers) and vertical channels extending into the stacked tiers, as well as the techniques of making such 3D semiconductor devices, may present some implementation challenges.

BRIEF DESCRIPTION OF THE DRAWINGS

FIGS. 2A-2H are cross-sectional views illustrating an example method of making a 3D semiconductor device, in which each figure illustrates a representative stage of forming the device, according to another embodiment of the application.

DETAILED DESCRIPTION

Figure 1A:
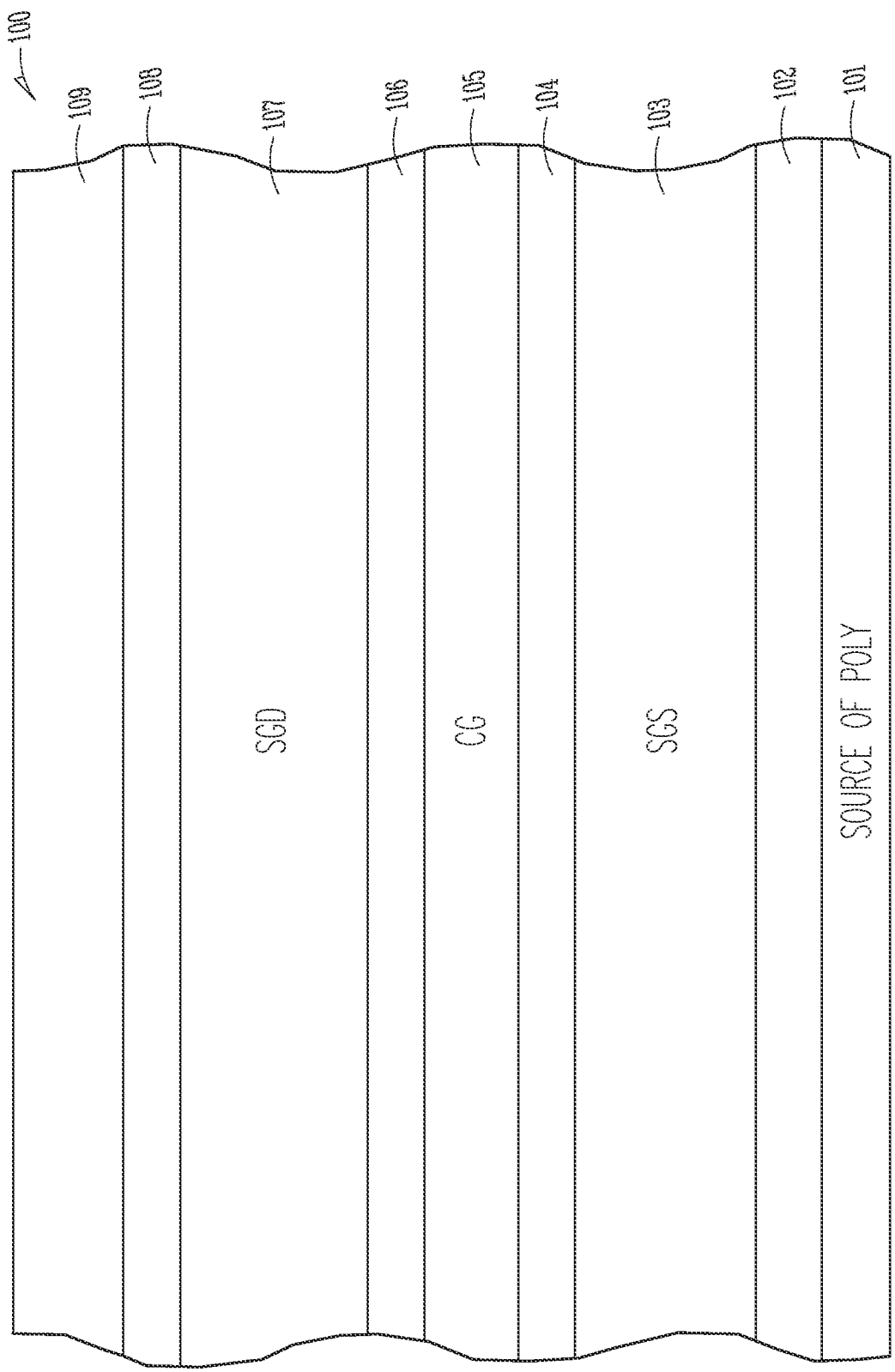
FIGS. 1A-1N are cross-sectional views illustrating an example method of making a 3D semiconductor device, in which each figure illustrates a representative stage of forming the device, according to an embodiment of the application.
Figure 1B:
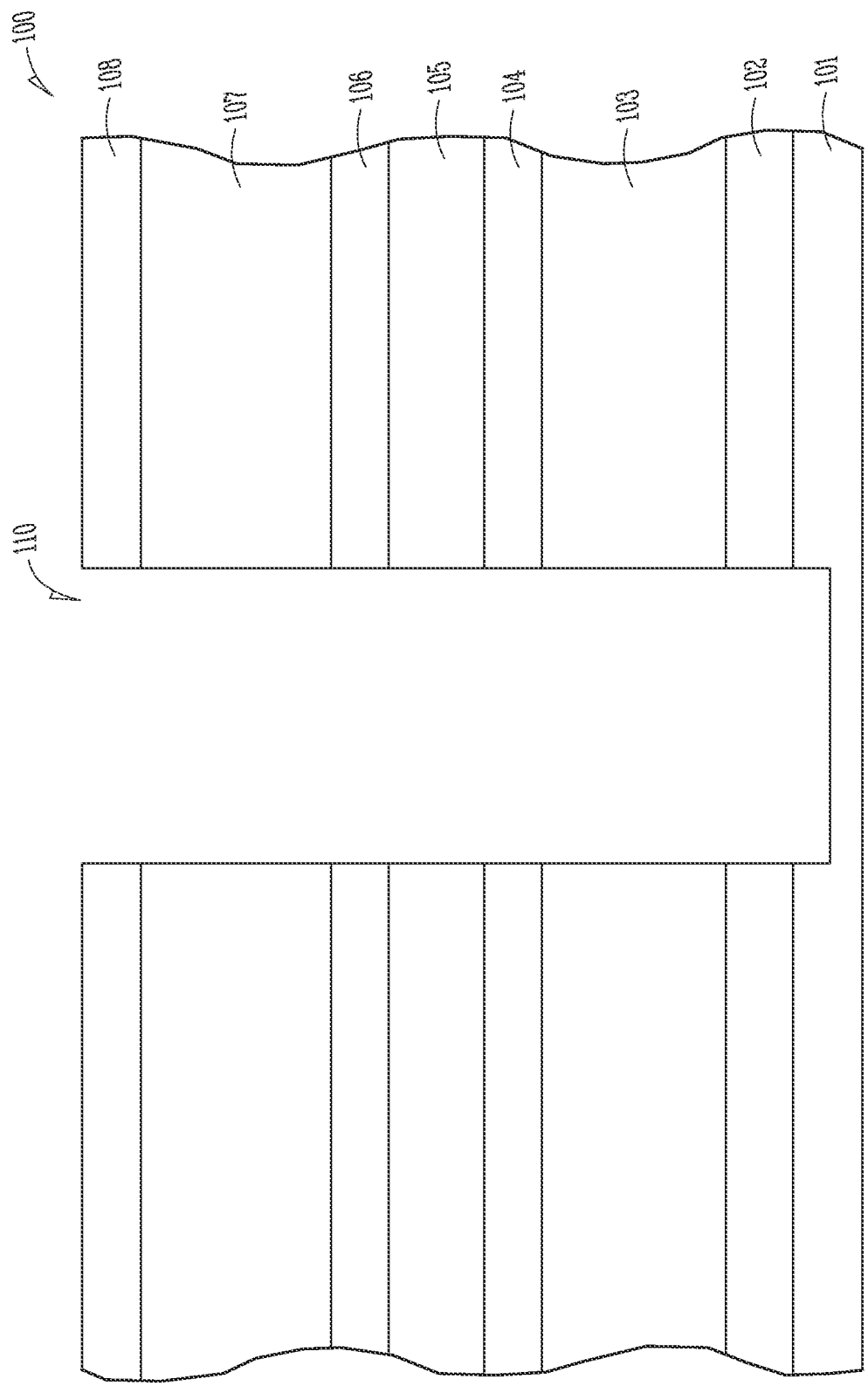

In the following detailed description of the embodiments, reference is made to the accompanying drawings which form a part hereof, and in which is shown by way of illustration specific illustrative embodiments in which some embodiments of the invention may be practiced.

Recently, 3D semiconductor devices (e.g., 3D NAND memory devices) have come into use due to severe scaling challenges. However, 3D semiconductor devices that include stacked tiers and channels extending into the stacked tiers impose structural and manufacturing challenges. For example, in 3D semiconductor devices, interfaces may exist inside channels that extend into stacked tiers.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

A NAND array architecture may be an array of memories (e.g., memory cells) arranged such that the memories of the array are coupled in logical rows to access lines (conventionally referred to as word lines). Some memories of the array are coupled together in series between source lines and data lines (conventionally referred to as bit lines).

In some embodiments described herein, an etch stop of oxide (e.g., aluminum oxide) may be applied on a source of polysilicon in a 3D semiconductor device.

In other embodiments described herein, an etch stop structure including a first etch stop of nitride and a second etch stop of oxide (e.g., aluminum oxide) may be applied on a source of Tungsten Silicide (hereinafter "WSiX") in a 3D semiconductor device.

Therefore, monolithic channels may be achieved in 3D semiconductor devices with reduced interfaces, punches, and backfills inside the channels such that relatively independent gate controls may be obtained.

In some embodiments described herein, different doping configurations may be applied to a select gate source (SGS), a control gate (CG) and a select gate drain (SGD), each of which, in this example, may be formed of or at least include polysilicon; with the result such that these tiers (e.g., including polysilicon) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

FIGS. 1A-1N are cross-sectional views illustrating an example method of making a 3D semiconductor device, in which each figure illustrates a representative stage of forming the device according to an embodiment of the application.

Initially referring to FIG. 1A, a stack structure 100 is formed. In some embodiments, the stack structure 100 may include a source 101 of polysilicon, an etch stop 102 of oxide on the source 101, an SGS 103 of polysilicon on the etch stop 102, a first isolation oxide 104 on the SGS 103, a CG 105 (e.g., including polysilicon) on the first isolation oxide 104, a second isolation oxide 106 on the CG 105, and an SGD 107 of poly on the second isolation oxide 106.

In some embodiments, the stack 100 may further include a cap 108 of nitride on the SGD 107. In some embodiments, the stack 100 may further include a hard mask 109 (e.g., of carbon) on the cap 108 of nitride.

Referring to FIG. 16, an opening 110 is formed by etching to vertically extend into the stack 100 to expose the source 101.

Figure 1C:
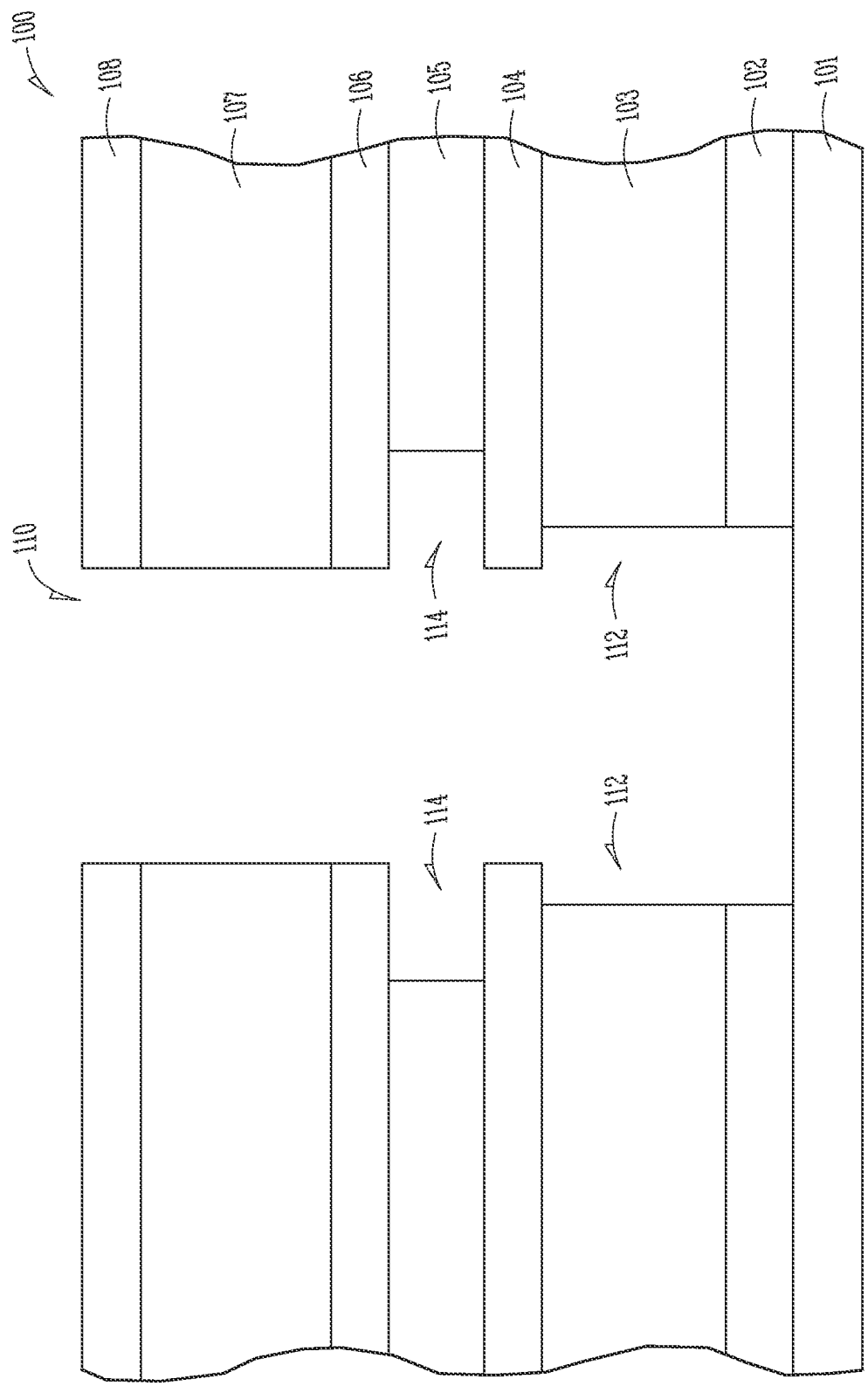

Referring to FIG. 1C, the opening 110 is laterally etched by using an etching solution (e.g., TMCH). Therefore, a first lateral recess 112 is formed into the SGS 103, and a second lateral recess 114 is formed into the CG 105. In some embodiments, the first recess 112 is formed into both the SGS 103 and the etch stop 102. As will be explained in more detail with reference to FIG. 3, doping configurations of the SGS 103, the CG 105, and the SGD 107 are different, and thus may lead to selective etchings into different tiers (e.g., the SGS 103, the CG 105, and the SGD 107) with different laterally recessed depths relative to the dimension of the original opening 110. In some embodiments, a first lateral depth of the first recess 112 into the SGS 103 is less than a second lateral depth of the second recess 114 into the CG 105, while the SGD 107 remains least recessed, or even remains unrecessed. As is apparent, once the lateral etching is performed, the lateral depth of these recesses changes the width of the opening at the etched tiers. Therefore, the width of the opening 110 adjacent the SGS 103 is greater than the width of the opening 110 adjacent the SGD 107.

Referring to FIG. 1D, a dielectric 116 is deposited on a bottom surface and a side surface of the opening 110 (as well as on surfaces of the first recess 112 and the second recess 114), and can be seen as an interpoly dielectric (IPD) structure 116. The IPD 116 may be formed as an "ONO" structure, including a first oxide 116A, a nitride 116B, and a second oxide 116C, with the nitride 116B between the first oxide 116A and the second oxide 116C.

Figure 1E:
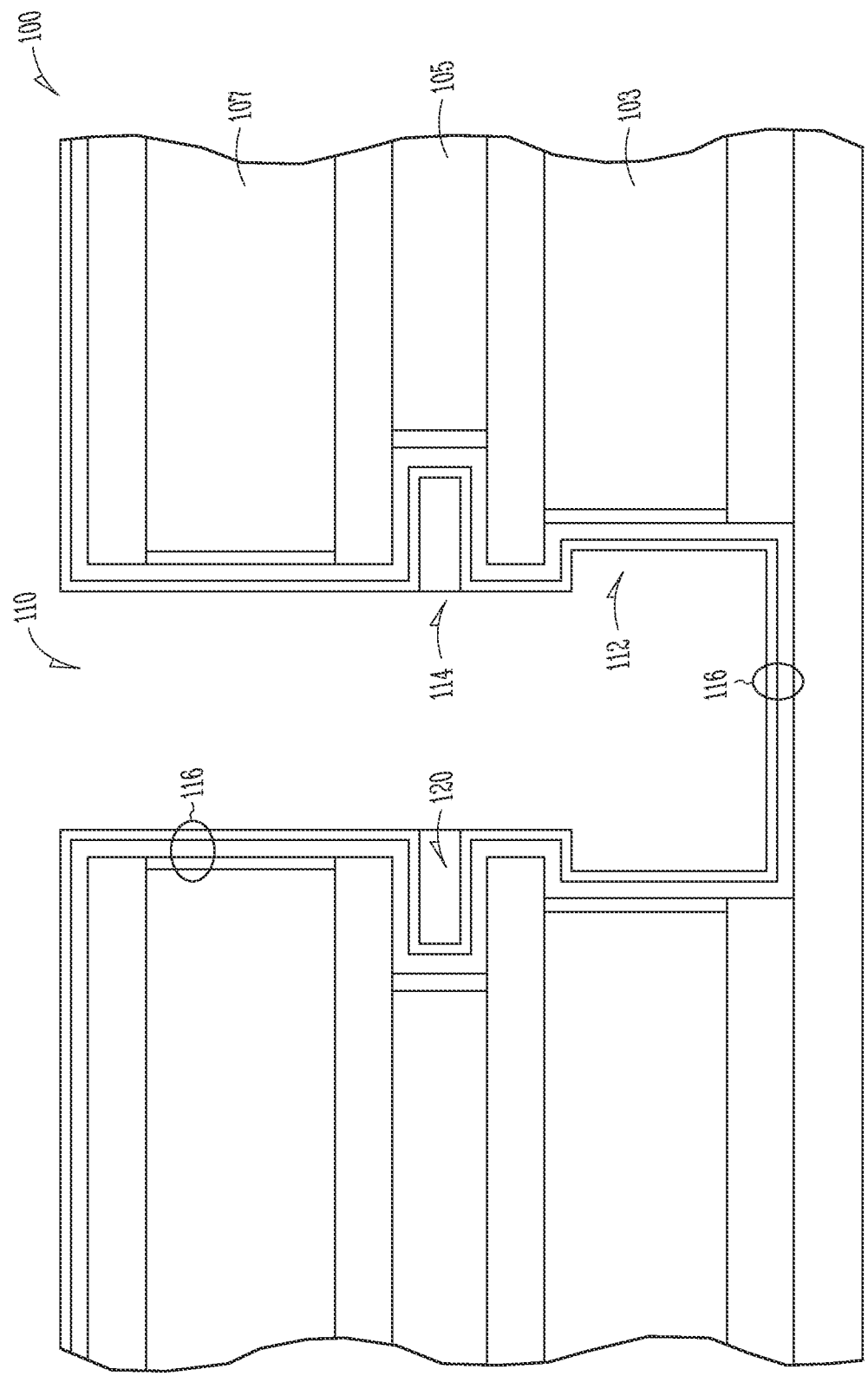

Referring to FIG. 1E, a charge storage structure, is formed in the second recess 114. In the depicted example, the charge storage structure includes a floating gate (FG) 120 including polysilicon formed in the second recess 114. In some embodiments, not shown in the drawings, the opening 110 (as well as the first recess 112 and the second recess 114) is first filled with polysilicon. Then, the polysilicon is removed from the opening 110 and the first recess 112, while the polysilicon remains in the second recess 114. The remaining portion of the CG 105 may function as a control gate. Therefore, the FG 120 is formed within the second recess 114, and is horizontally separated from the CG 105 by the IPO 116.

Referring to FIG. 1F, a gate oxide 122 is formed on a side surface of the FG 120 facing towards the opening 110 to function as a tunnel oxide.

In some embodiments, some portions of the IPD 116 are removed from the side surface and the bottom surface of the opening 110. In some embodiments, a large portion (e.g., the nitride 116B and the second oxide 116C) of the IPD 116 is removed from the side of the opening 110, while a small portion (e.g., the second oxide 116C) of the IPD 116 is removed from the bottom surface of the opening 110. Therefore, the first oxide 116A of the IPD 116 may remain on the side surface of the opening 110, and the first oxide 116A and the nitride 116B of the IPD 116 may remain on the bottom surface of the opening 110.

Referring to FIG. 1G, a liner 130A of polysilicon is formed on the bottom surface and the side surface of the opening 110. In some embodiments, the liner 130A of polysilicon may be deposited on the bottom surface and the side surface of the opening 110.

Figure 1H:
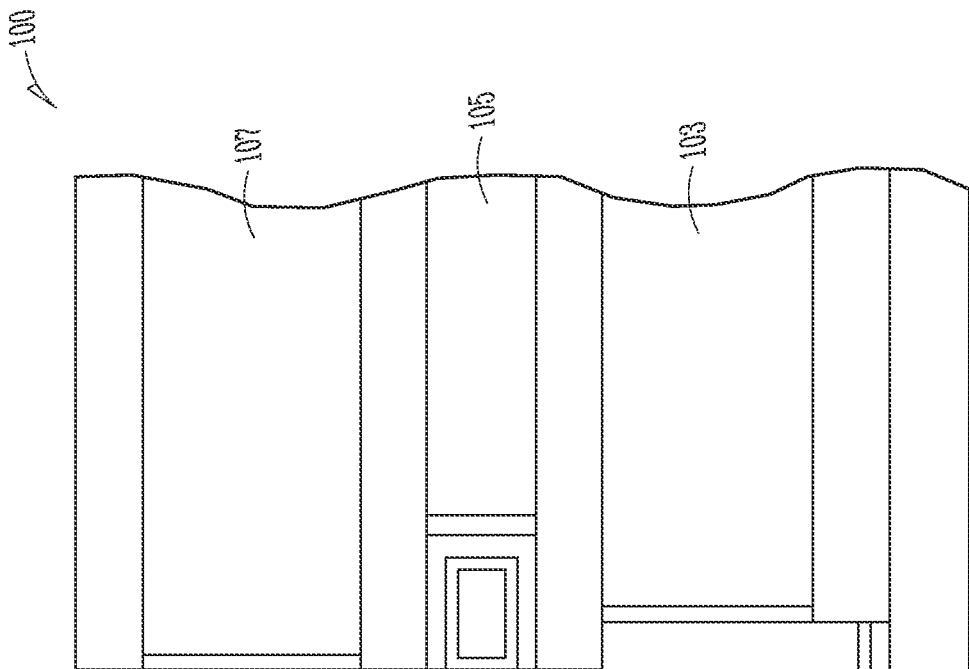
Figure 1H:
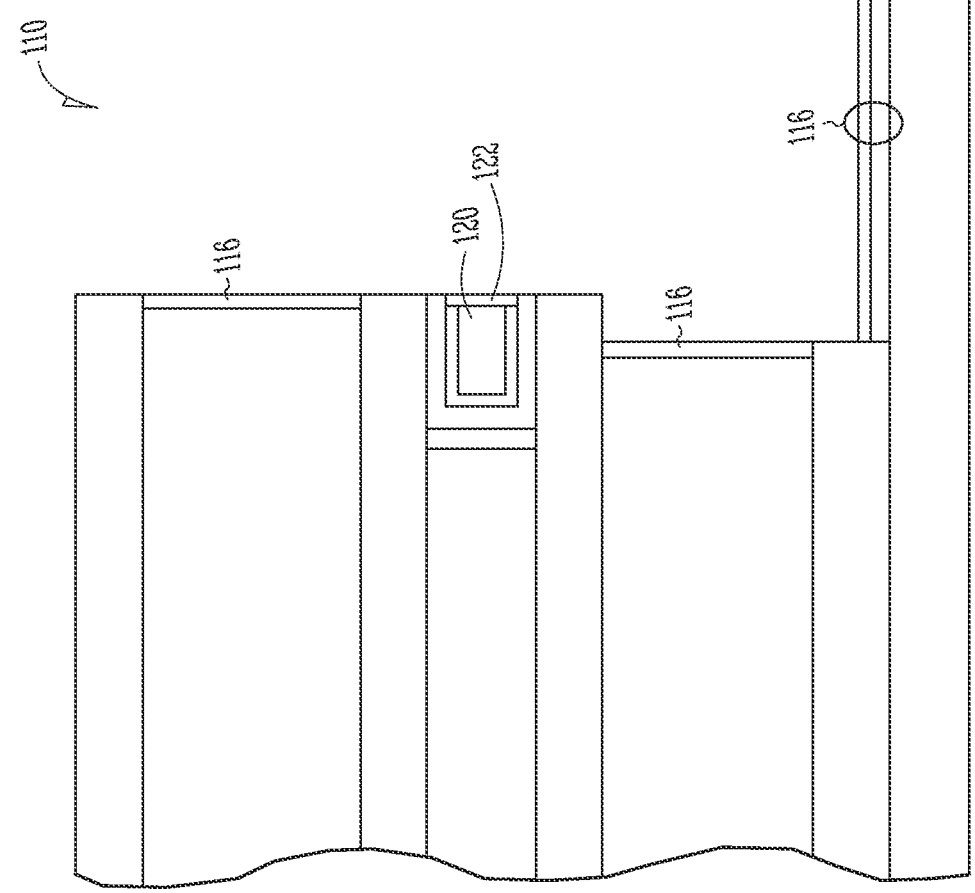
Figure 1H:
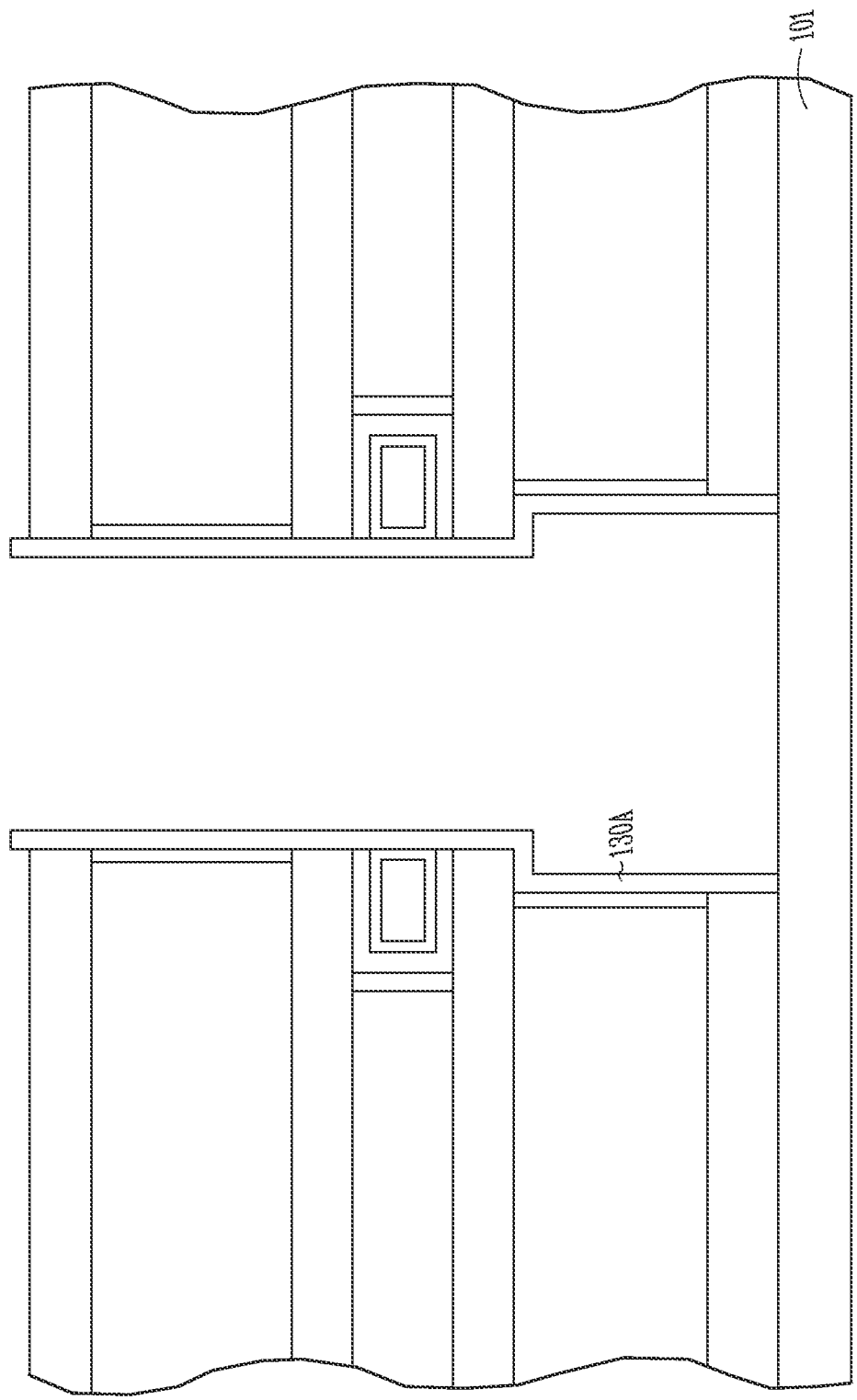

Referring to FIG. 1H, the liner 130A of polysilicon and the IPD 116 on the bottom surface of the opening 110 are removed (e.g., punched away) by a downward etching to expose the source 101, while the liner 103A of polysilicon on the side surface of the opening 110 remains. During the downward etching process, the IPD 116 on the bottom surface of the opening 110 may function as a protection (e.g., an etch stop) to the source 101.

Referring to FIG. 1I, a deposition 130B of polysilicon is formed on the top surface of the source 101 by a downward deposition. Therefore, the deposition 130B of polysilicon is in contact with the liner 130A of polysilicon that is deposited on the side surface of the opening 110. An integrated channel 130 (including both the liner 103A and the deposition 130B) is thus formed to work with the source 101, the SGS 103, the FG 120, and the SGD 107.

In some embodiments, the channel 130 contacts the source 101 at a lower portion of the opening 110, and is laterally separated from the SGS 103, the FG 120, and the SGD 107 by oxides.

Referring to FIG. 1J, in some embodiments, the opening 110 is filled with an oxide filler 140.

Figure 1L:
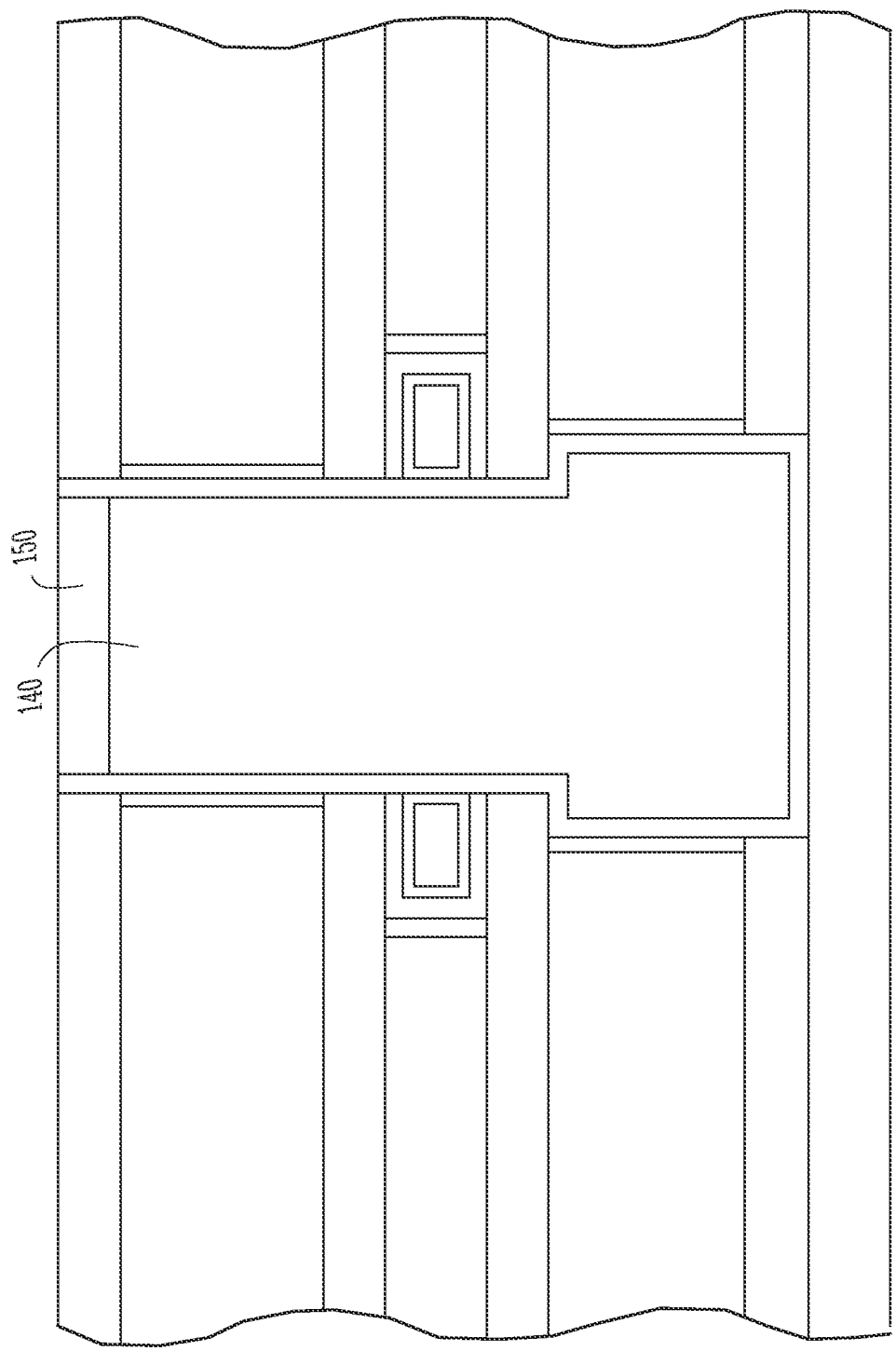

Referring to FIG. 1K, in some embodiments, the oxide filler 140 is removed from an upper portion of the opening 110 to form a shallow recess 110A, which extends from a top of the opening 110 to a level adjacent to the SGD 107. Referring to FIG. 1L, a polysilicon filler 150 can be filled into the shallow recess 110A (formed in the upper portion of the opening 110) to form a plug 150 of polysilicon.

Figure 1M:
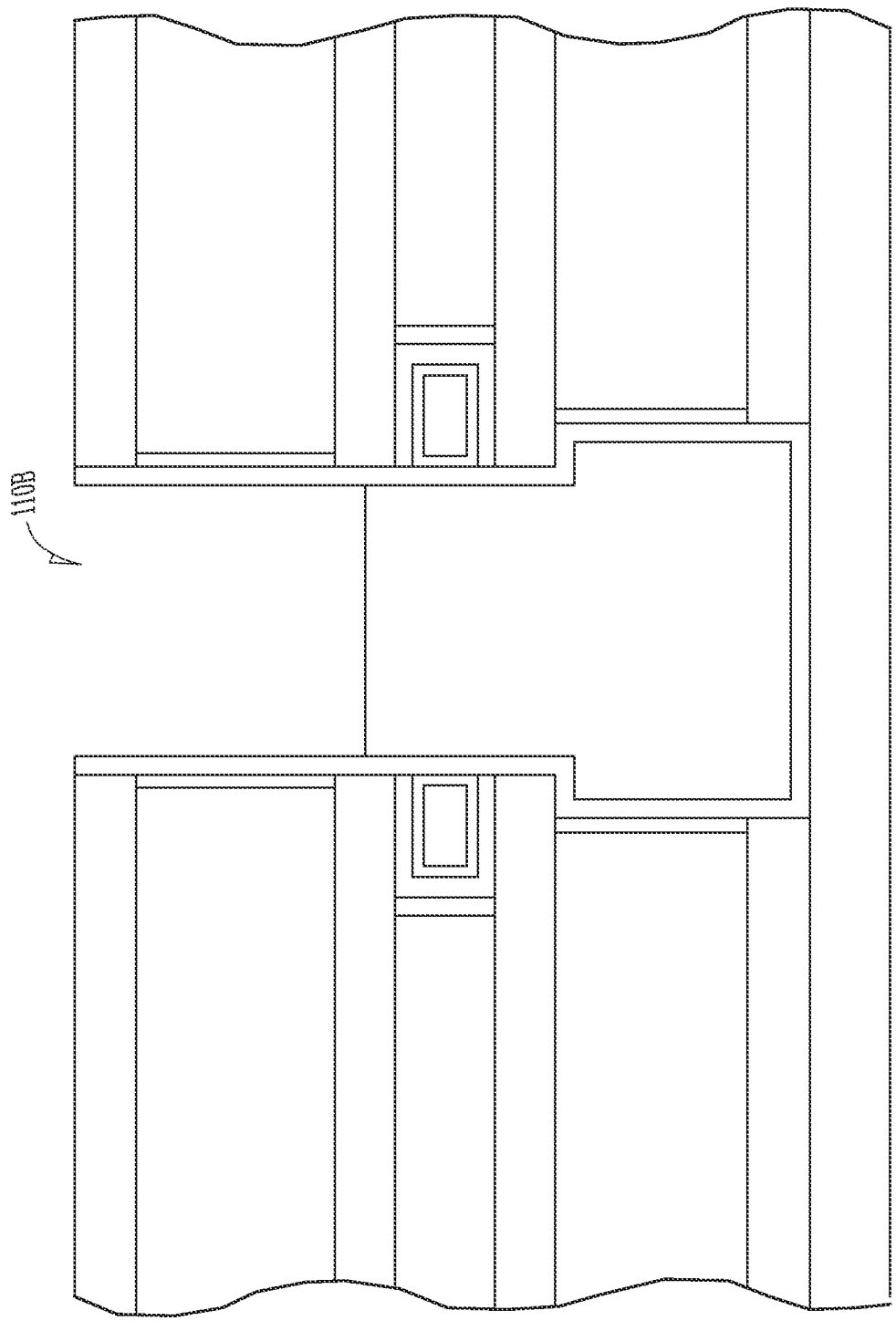

Referring to FIG. 1M, in other embodiments, the oxide filler 140 is removed from an upper portion of the opening 110 to form a deep recess 110B, which extends from the top of the opening 110 to a level adjacent to the FG 120. Referring to FIG. 1N, a polysilicon filler 150 can be filled into the deep recess 110B (formed in the upper portion of the opening 110) to form a plug 150 of polysilicon.

Therefore, a semiconductor device 100, as illustrated above, may have an integrated channel 130 without interfaces inside the channel. This process of making such a semiconductor device may provide relatively independent control of gates.

FIGS. 2A-2H are cross-sectional views illustrating an example method of making a 3D semiconductor device, in which each figure illustrates a representative stage of forming the device, according to another embodiment of the application.

Figure 2A:
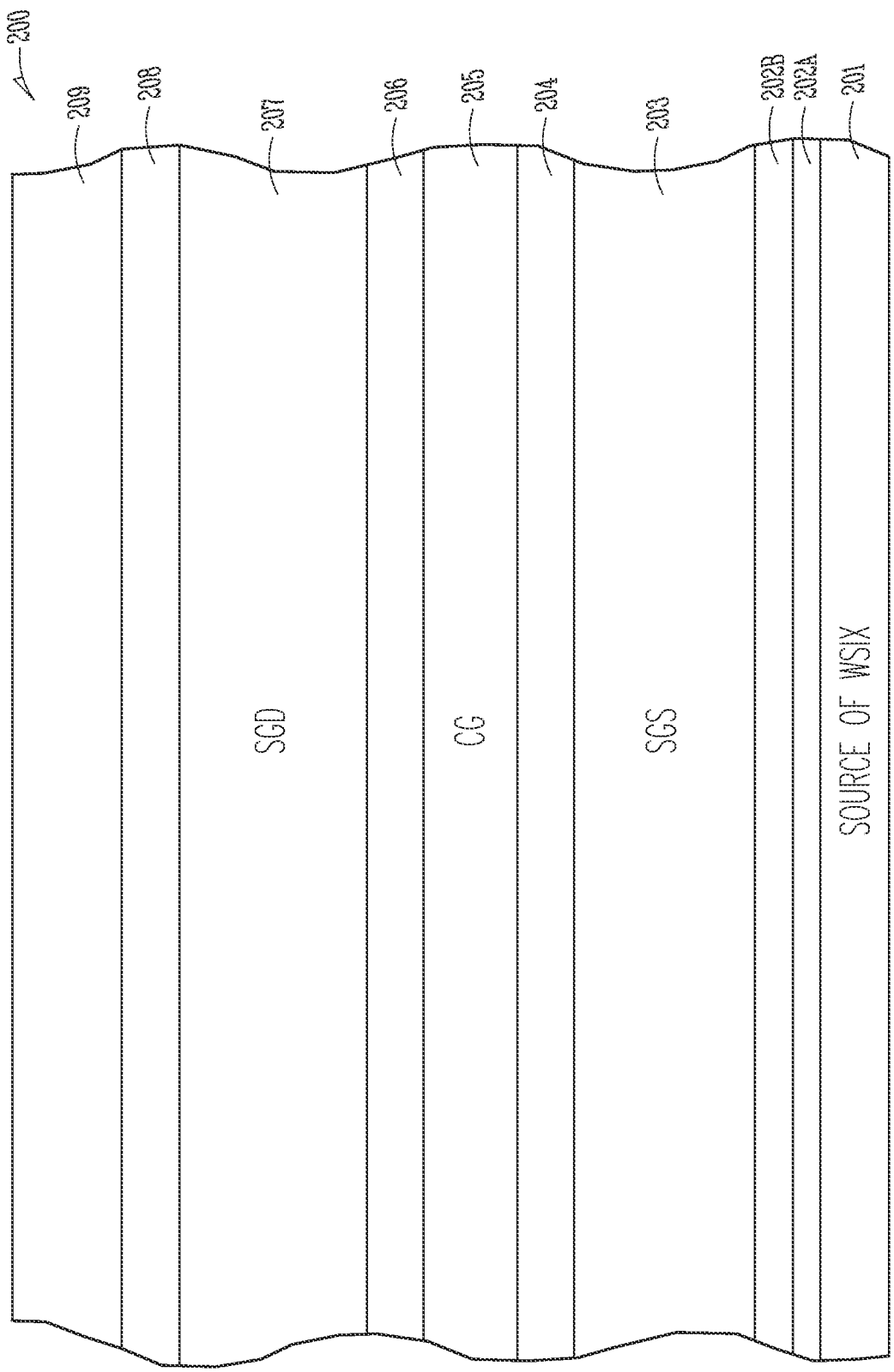

Initially referring to FIG. 2A, a stack structure 200 is formed. In some embodiments, the stack structure 200 may include a source 201 of WSiX, a first etch stop 202A of nitride on the source 201, a second etch stop 202B of oxide on the first etch stop 202A, a SGS 203 of polysilicon on the second etch stop 202B, a first isolation oxide 204 on the SGS 203, a CG 205 of polysilicon on the first isolation oxide 204, a second isolation oxide 206 on the CG 205, and a SGD 207 of polysilicon on the second isolation oxide 206.

In some embodiments, the stack 200 may further include a cap 208 of nitride on the SGD 207. In some embodiments, the stack 100 may further include a hard mask 209 (e.g., of carbon) on the cap 208 of nitride.

Figure 2B:
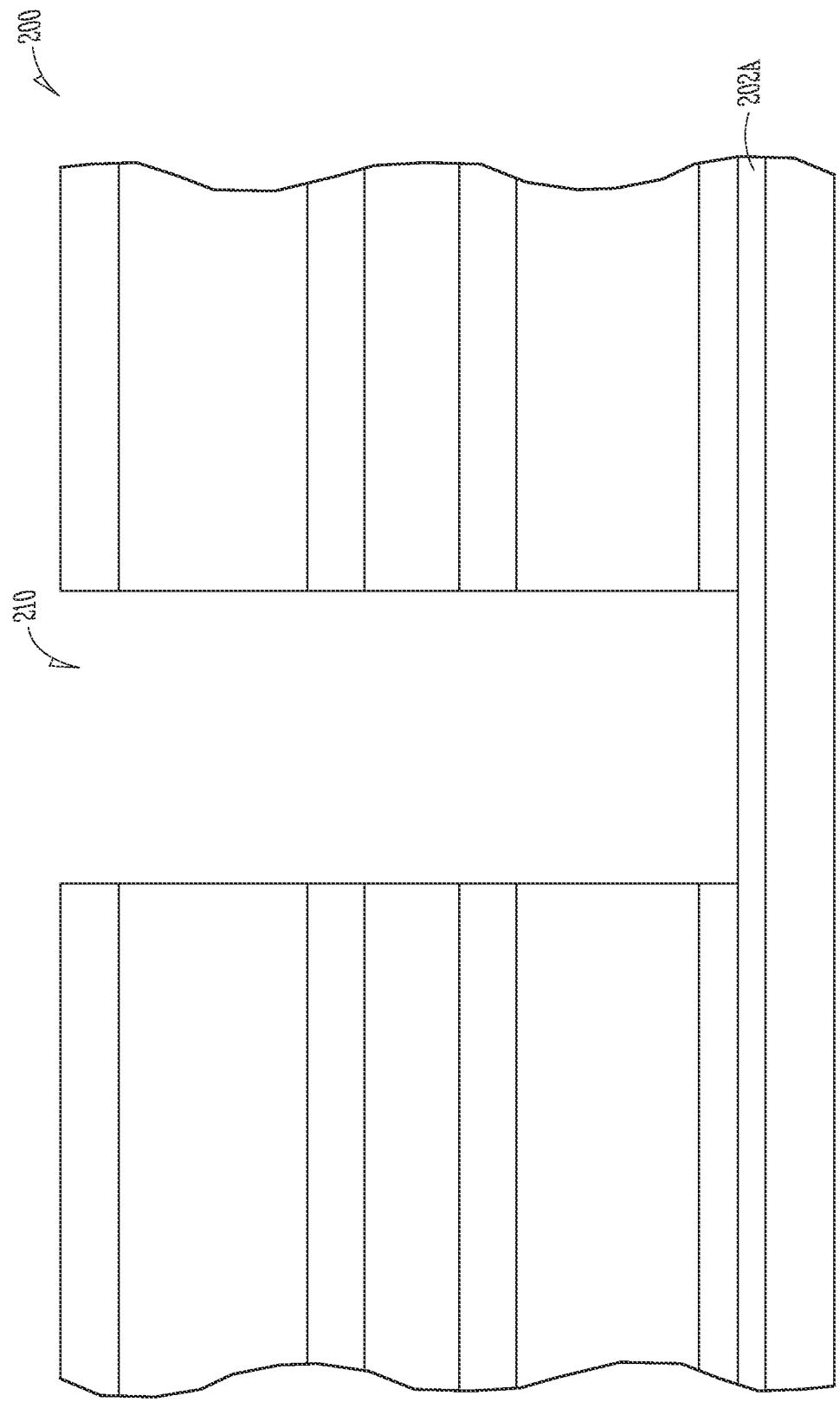

Referring to FIG. 2B, an opening 210 is formed to vertically extend into the stack 200 by etching to a level adjacent to the first etch stop 202A to expose the first etch stop 202A.

Figure 2C:
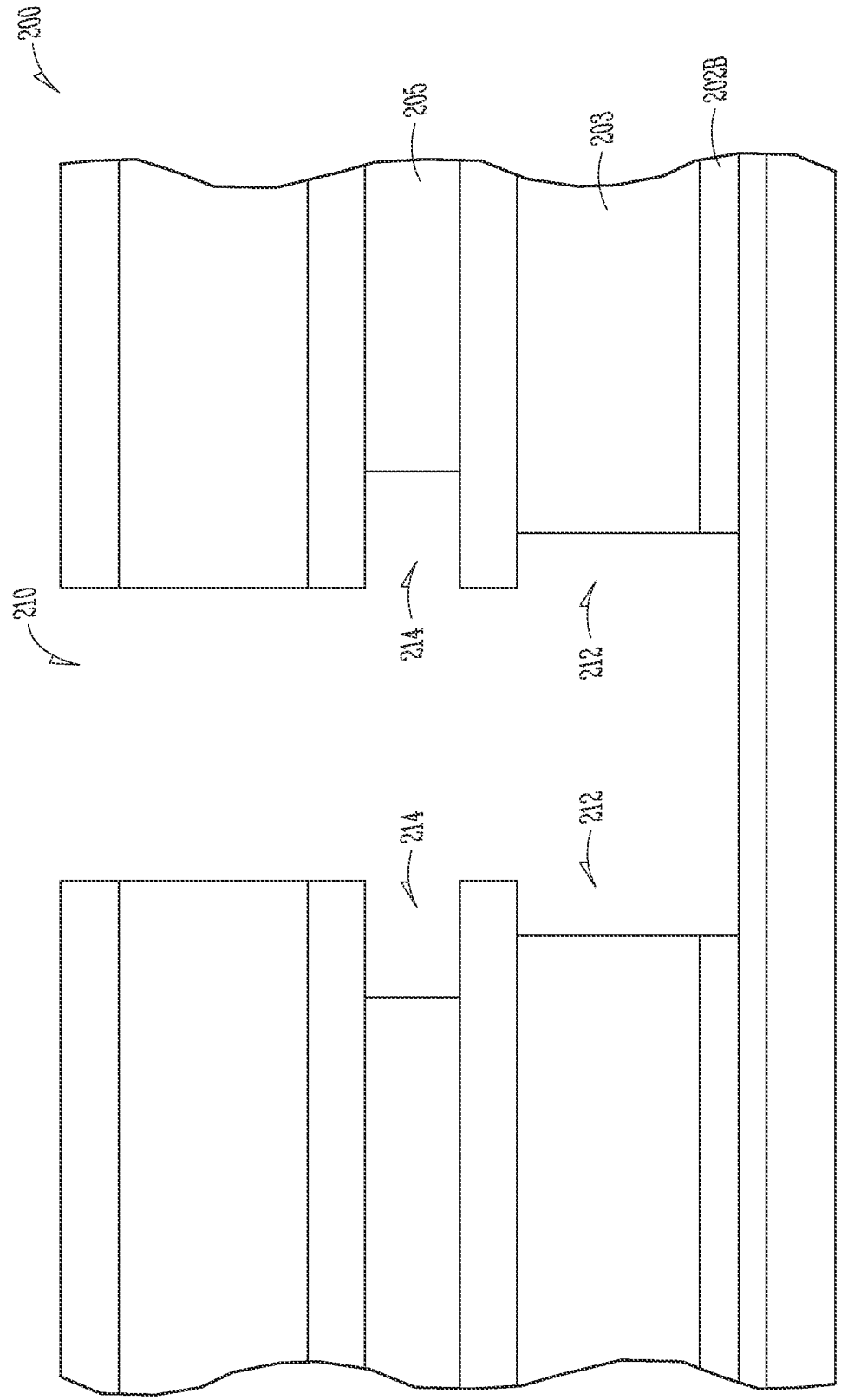

Referring to FIG. 2C, the opening 210 is laterally etched by using an etching solution (e.g., TMCH) such that a first recess 212 is formed into the SGS 203 and a second recess 214 is formed into the CG 205. In some embodiments, a first lateral depth of the first recess 212 into the SGS 203 is less than a second lateral depth of the second recess 214 into the CG 205, while the SGD 207 remains least recessed, or even not recessed. Therefore, the width of the opening 210 adjacent the SGS 203 is greater than the width of the opening 210 adjacent the SGD 207.

Figure 2D:
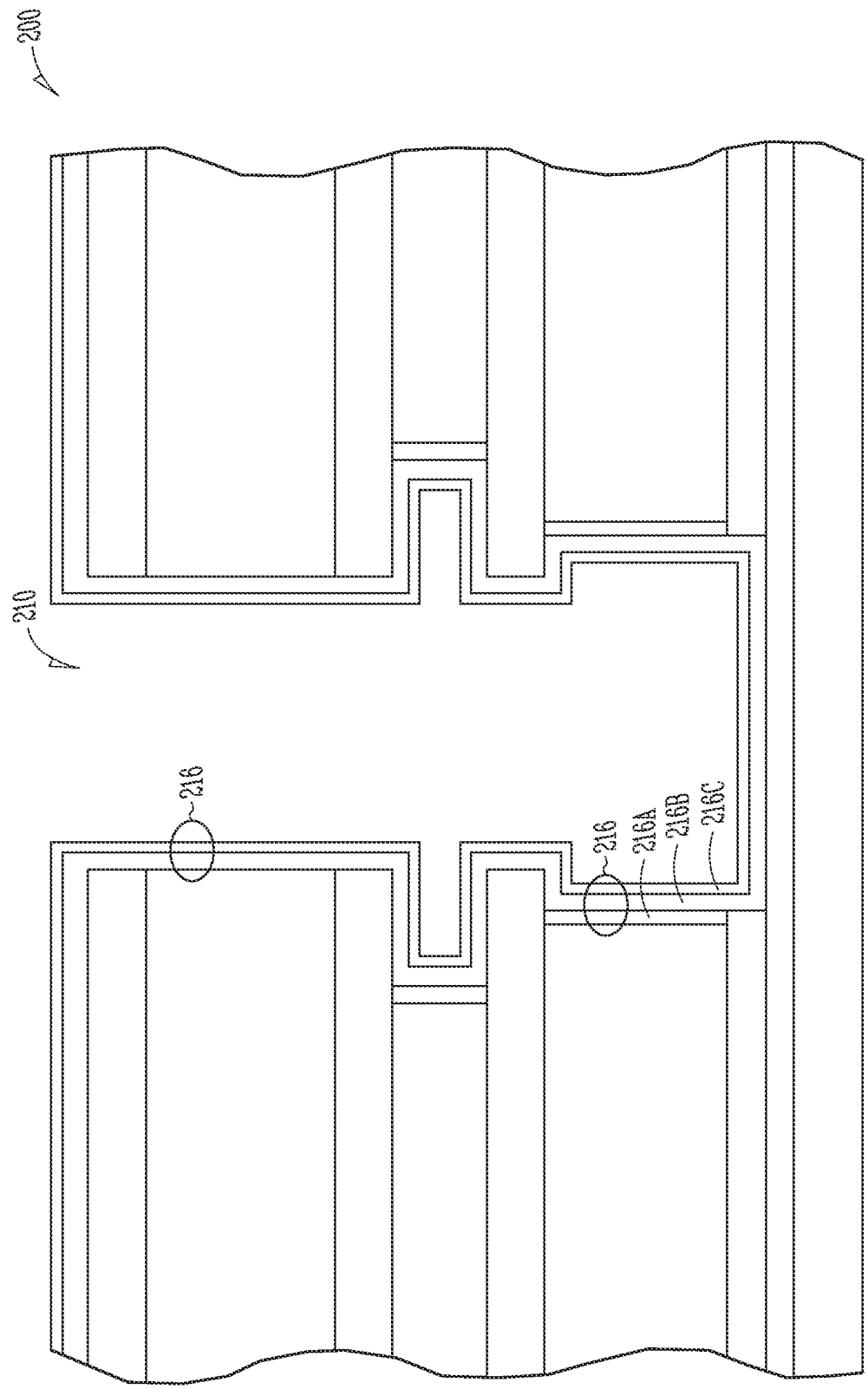

Referring to FIG. 2D, an interpoly dielectric (IPD) 216 is deposited on a bottom surface and a side surface of the opening 210 (as well as on surfaces of the first recess 212 and the second recess 214). The IPD 216 may include a first oxide 216A, a nitride 216B, and a second oxide 216C. The nitride 216B is between the first oxide 216A and the second oxide 216C.

Referring to FIG. 2E, a FG 220 of polysilicon is formed in the second recess 214. In some embodiments, not shown in the drawings, the opening 210 (as well as the first recess 212 and the second recess 214) is first filled with a polysilicon material. Then, the polysilicon material is removed by etching from the opening 210 and the first recess 212, while the polysilicon material remains in the second recess 214. The first etch stop 202A may function as an etch stop to protect the source 201 of WSiX during the etching process. The remaining portion of the CG 205 may function as a control gate. Therefore, the FG 220 is formed within the second recess 214, and is horizontally separated from the CG 205 by the IPO 216.

Referring to FIG. 2F, a gate oxide 222 is formed on a side surface of the FG 220 facing towards the opening 210. The gate oxide 222 may function as a tunnel oxide.

Figure 2H:
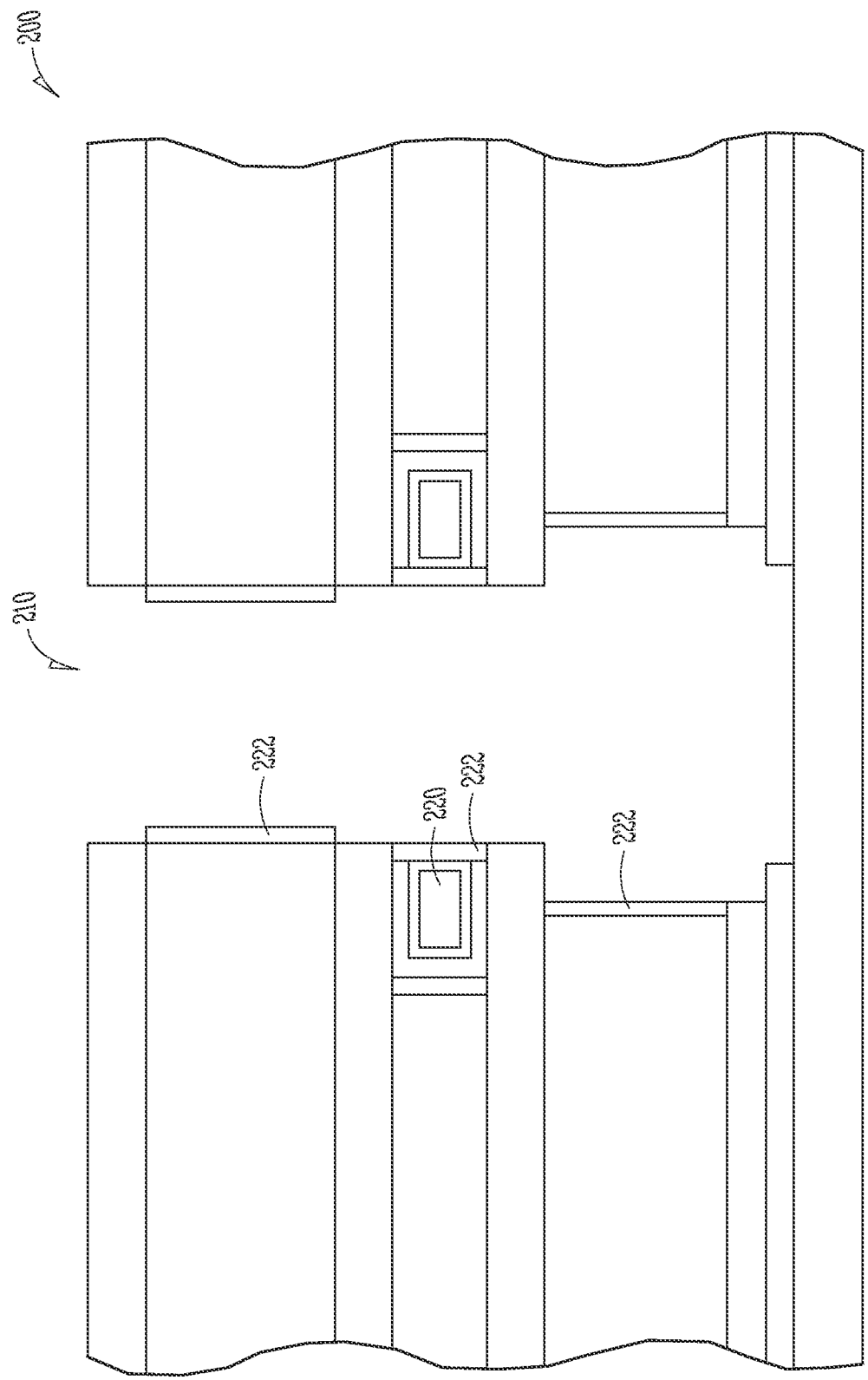
Figure 2G:
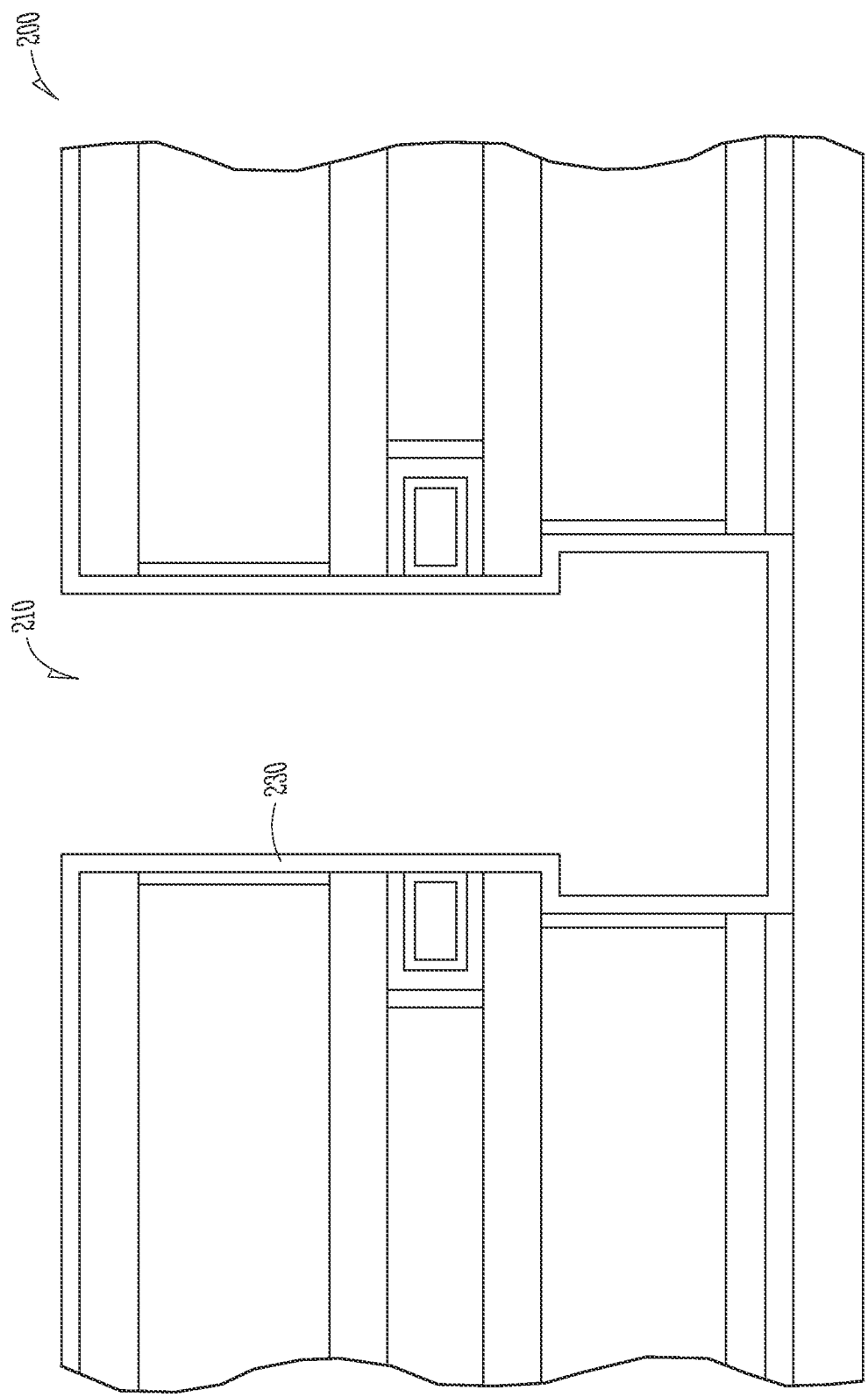
Figure 2H:
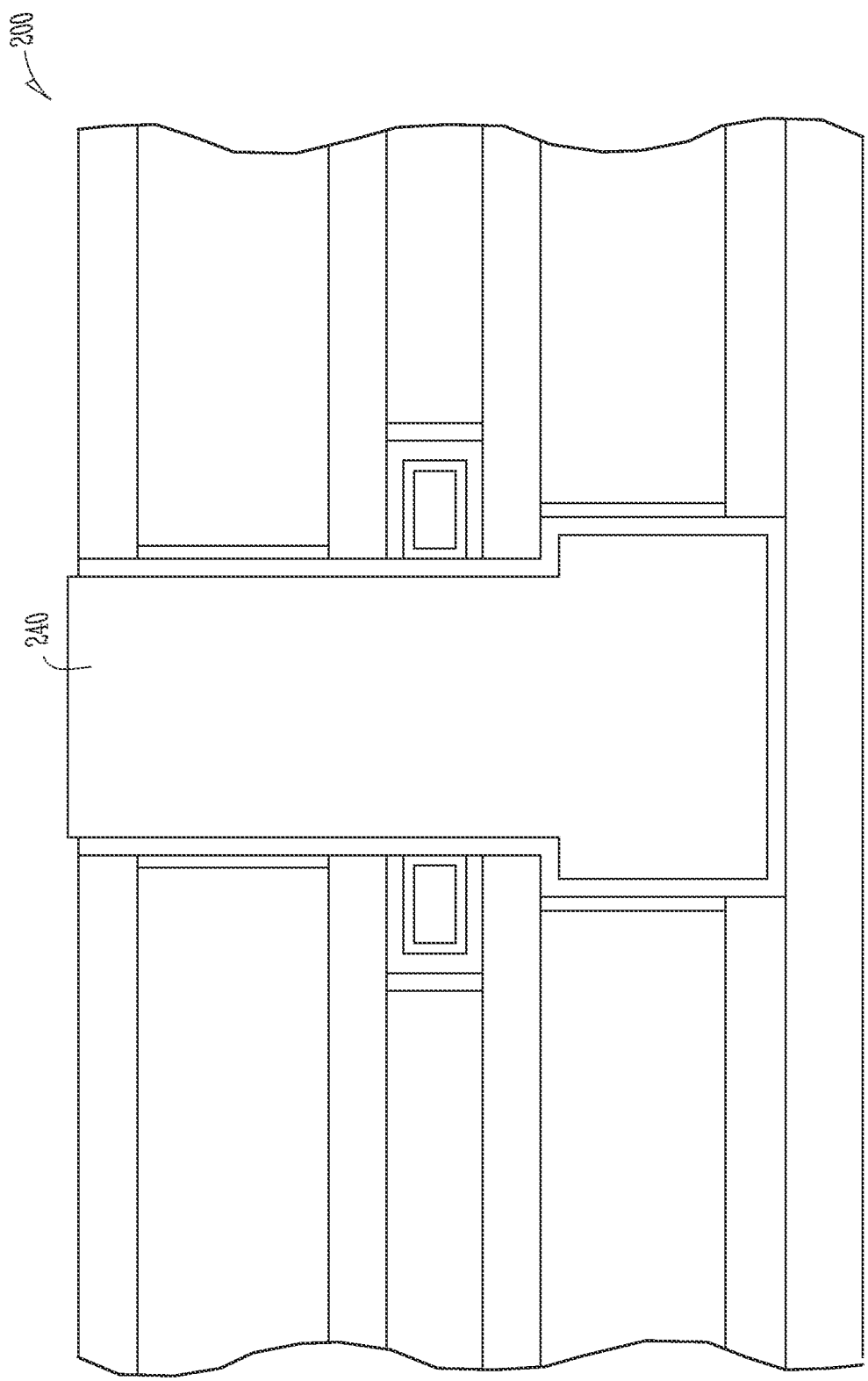

Referring to FIG. 2G, a liner 230 of polysilicon is deposited on the bottom surface and the side surface of the opening 210 to function as an integrated channel.

Referring to FIG. 2H, in some embodiments, the opening 210 is filled with an oxide filler 240.

Similar to the embodiments of the semiconductor device 100 as shown in FIGS. 1L and 1N, a plug of polysilicon may be formed in an upper portion of the opening 210. In some embodiments, a plug of polysilicon may extend from the top surface of the opening 210 to a shallow level adjacent to the SGD 207. In other embodiments, the plug of polysilicon may extend from the top surface of the opening 210 to a deep level adjacent to the FG 220.

Therefore, a semiconductor device 200, as illustrated above, may have an integrated channel 230 without interfaces inside the channel.

Figure 3:
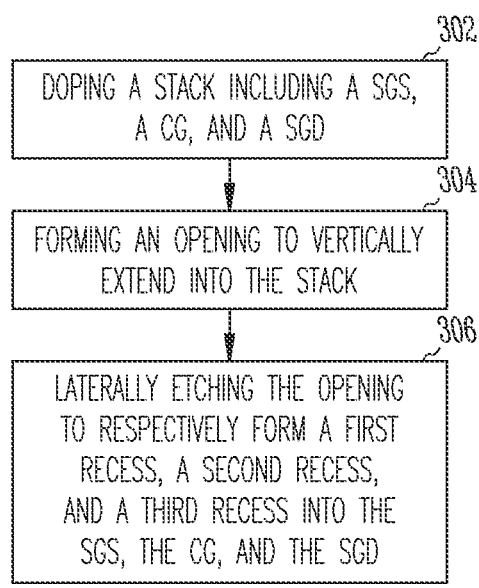
FIG. 3 is a flow chart illustrating a method of making a 3D semiconductor device according to an embodiment of the application.

FIG. 3 is a flow chart illustrating a method of making a 3D semiconductor device according to an embodiment of the application.

In some embodiments, during a process of making a semiconductor device, among other things, different material configurations (such as doping differences) may be employed within a stack of an SGS, a CG, and an SGD of polysilicon so as to obtain different etching rates for the tiers by using an etching solution (e.g., TMAH). Therefore, a monolithic pillar may be created in a semiconductor device, in which the SGS and the CG of polysilicon respectively form recesses, while the SGD of polysilicon is prevented from being etched, and thus is much less recessed, or even unrecessed.

Referring to FIG. 3, at 302, a stack (e.g., 100) including an SGS (e.g., 103), a CG (e.g., 105), and an SGD (e.g., 107) of polysilicon is doped, in which the SGS is doped with a first doping configuration, the CG is doped with a second doping configuration, and the SGD is doped with a third doping configuration.

At 304, an opening (e.g., 110) is formed by etching to vertically extend into the stack.

At 306, the opening is laterally etched to form a first recess (e.g., 112) into the SGS, a second recess (e.g., 114) into the CG, and a third recess (not shown) into the SGD. In some embodiments, TMAH may be used to laterally etch the opening to form recesses into the SGS, the CG, and the SGD.

Therefore, after the lateral etching process, a first depth of the first recess etched into the SGS relative to the original dimension of the opening (110) is less than a second depth of the second recess etched into the CG, while a third depth of the third recess etched into the SGD is much less than the first depth of the first recess etched into the SGS. In some embodiments, after the lateral etching process, the SGD may remain unrecessed.

In some embodiments, at 302, the SGS (e.g., 103) of polysilicon is doped with boron at a doping concentration of about $1 \times 2E20$ $cm^{-3}$ during a deposition of the SGS, the CG (e.g., 105) of polysilicon is doped with phosphorus at a doping concentration of about $1E21$ $cm^{-3}$ during a Plasma Enhanced Chemical Vapor Deposition (PECVD) of the CG, and the SGD (e.g., 107) of polysilicon is doped with boron at a doping concentration of about $1E21$ $cm^{-3}$ in a diffusion furnace.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a PECVD of the CG, and the SGD of polysilicon is doped with boron at a doping concentration of about $2E20$ $cm^{-3}$ in a diffusion furnace.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a PECVD of the CG, and the SGD of polysilicon is doped with carbon at a doping concentration of about $1E16$ $cm^{-3}$.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a Plasma Enhanced Chemical Vapor Deposition (PECVD) of the CG, and the SGD of polysilicon is doped with boron at a doping concentration of about $2E20$ $cm^{-3}$ during a PECVD of the SGD.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a PECVD of the CG, and the SGD of polysilicon is doped with about 1% to about 10% of $N_2$.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a PECVD of the CG, and the SGD of polysilicon is doped with boron at a doping concentration of about $2E20$ $cm^{-3}$ in a diffusion furnace.

In some embodiments, at 302, the SGS of polysilicon is doped with boron at a doping concentration of about $1 \times 2E20$ $cm^{-3}$ during a deposition of the SGS, the CG of polysilicon is doped with phosphorus at a doping concentration of about $1E21$ $cm^{-3}$ during a PECVD of the CG, and the SGD of polysilicon is doped with $NH_3$.

In some embodiments, at 302, the SGS of polysilicon is doped boron at a doping concentration of about $1 \times 2E20$ $cm^{-3}$ during a deposition of the SGS, the CG of polysilicon is doped with phosphorus at a doping concentration of about 1E21 cm$^{-3}$ during a Plasma Enhanced Chemical Vapor Deposition (PECVD) of the CG, and the SGD of polysilicon is doped with germanium at a doping concentration of about 2E20 cm$^{-3}$ using an ion beam implant.

FIGS. 4A-4H are cross-sectional views illustrating an example method of making a 3D semiconductor device, in which each figure illustrates a representative stage of forming the device, according to another embodiment of the application.

Figure 4A:
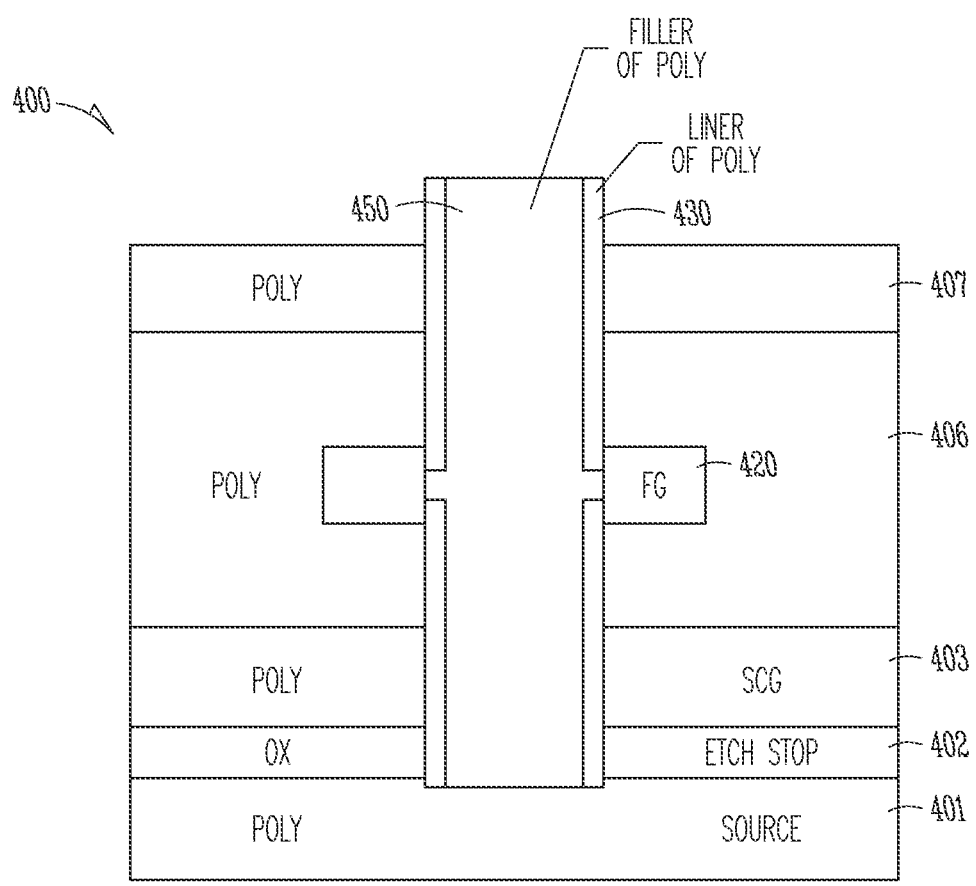
FIGS. 4A-4H are cross-sectional views illustrating an example method of making a 3D semiconductor device, in which each figure illustrates a representative stage of forming the device, according to another embodiment of the application.

Initially referring to FIG. 4A, a stack structure 400 is formed. In some embodiments, the stack structure 400 may include a source 401 of polysilicon, an etch stop 402 of oxide on the source 401, an SGS 403 of polysilicon on the etch stop 402, a tier stack 406 including at least one FG 420, and a tier of polysilicon 407 on the tier stack 406. In some embodiments, an opening 450 may vertically extend into the stack 400 to expose the source 401. In some embodiments, the opening 450 may include a liner 430 of polysilicon. In some embodiments, the opening 450 may be filled with polysilicon.

Figure 4B:
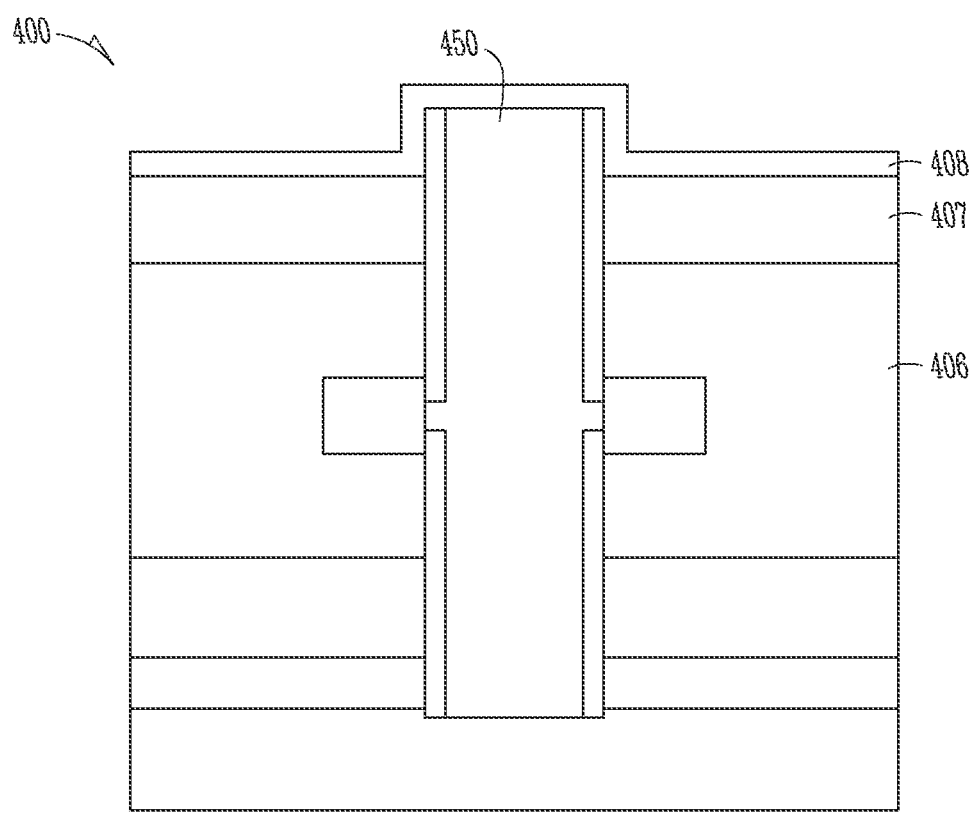

Referring to FIG. 4B, in some embodiments, the stack 400 may further include a cap 408 of nitride on the tier of polysilicon 407.

Figure 4C:
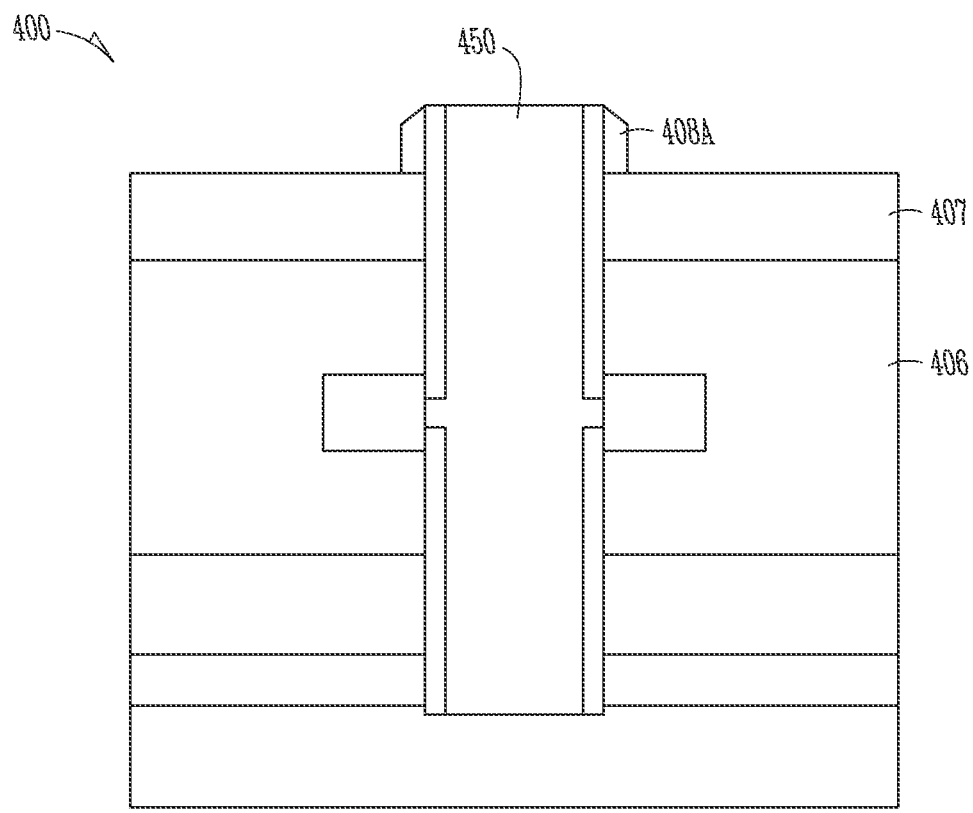

Referring to FIG. 4C, in some embodiments, spacers 408A may be formed by downward etching the cap 408 of nitride to expose the tier of polysilicon 407.

Figure 4D:
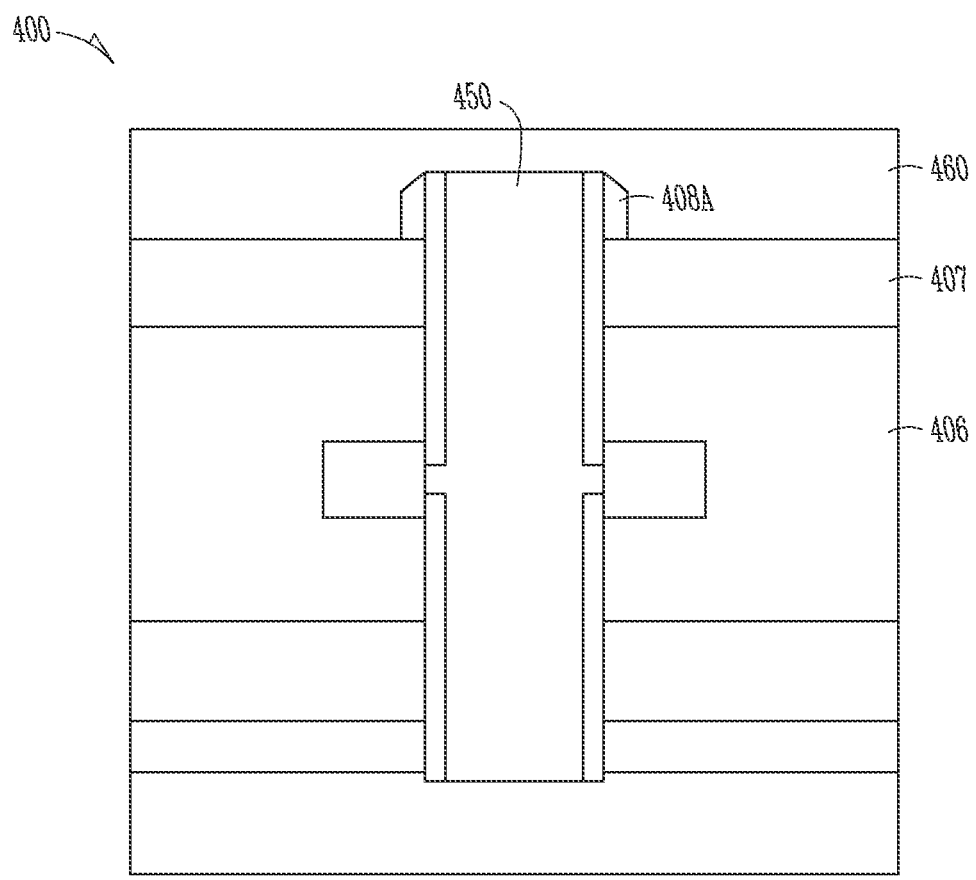

Referring to FIG. 4D, in some embodiments, a protection layer 460 may be formed over the surfaces of the opening 450, the spacers 408A, and the tier of polysilicon 407. In some embodiments, the protection layer 460 may include multi-layer resist (MLR) material.

Figure 4E:
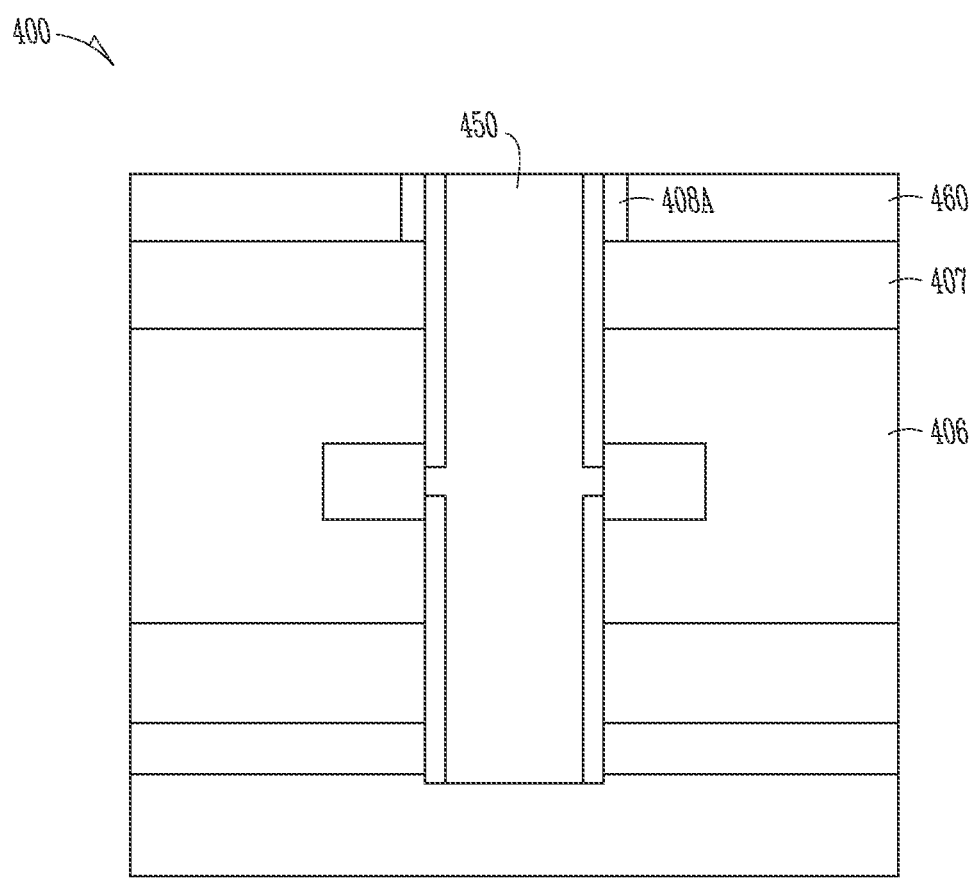

Referring to FIG. 4E, in some embodiments, the top surfaces of the opening 450 and the spacers 408A may be planarized with the protection of the protection layer 460 of MLR.

Figure 4F:
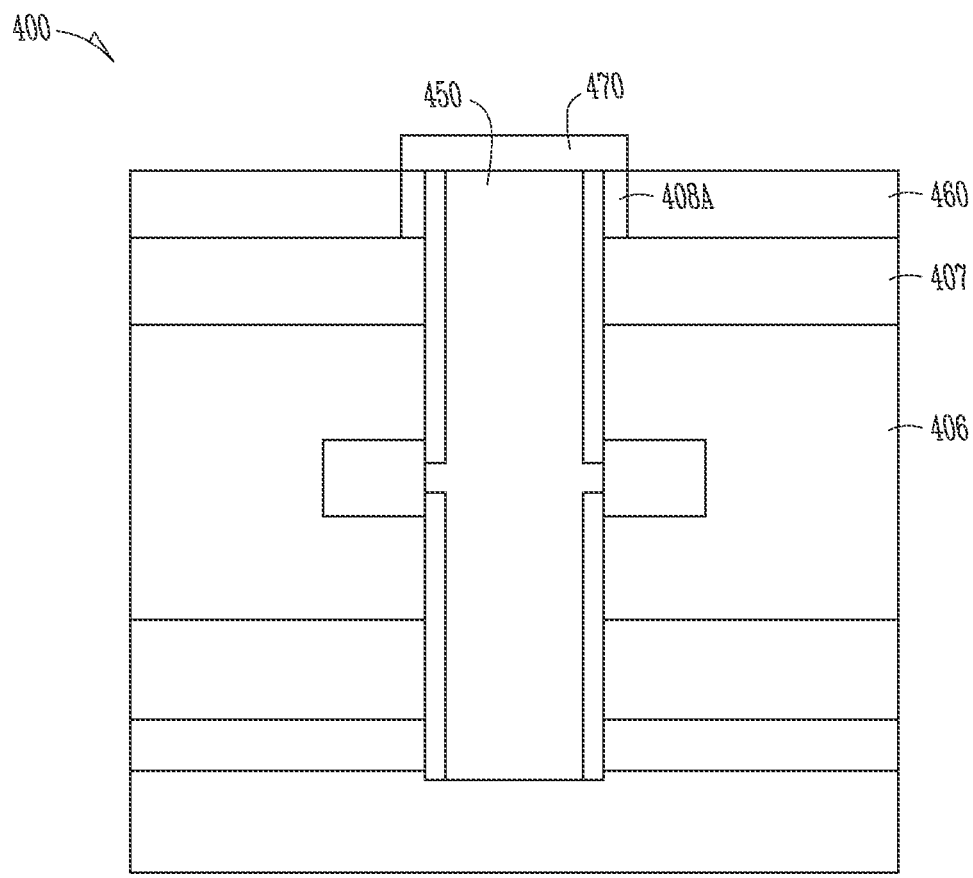

Referring to FIG. 4F, in some embodiments, a mask 470 may be formed on the planarized top surfaces of the opening 450 and the spacers 408A.

Figure 4G:
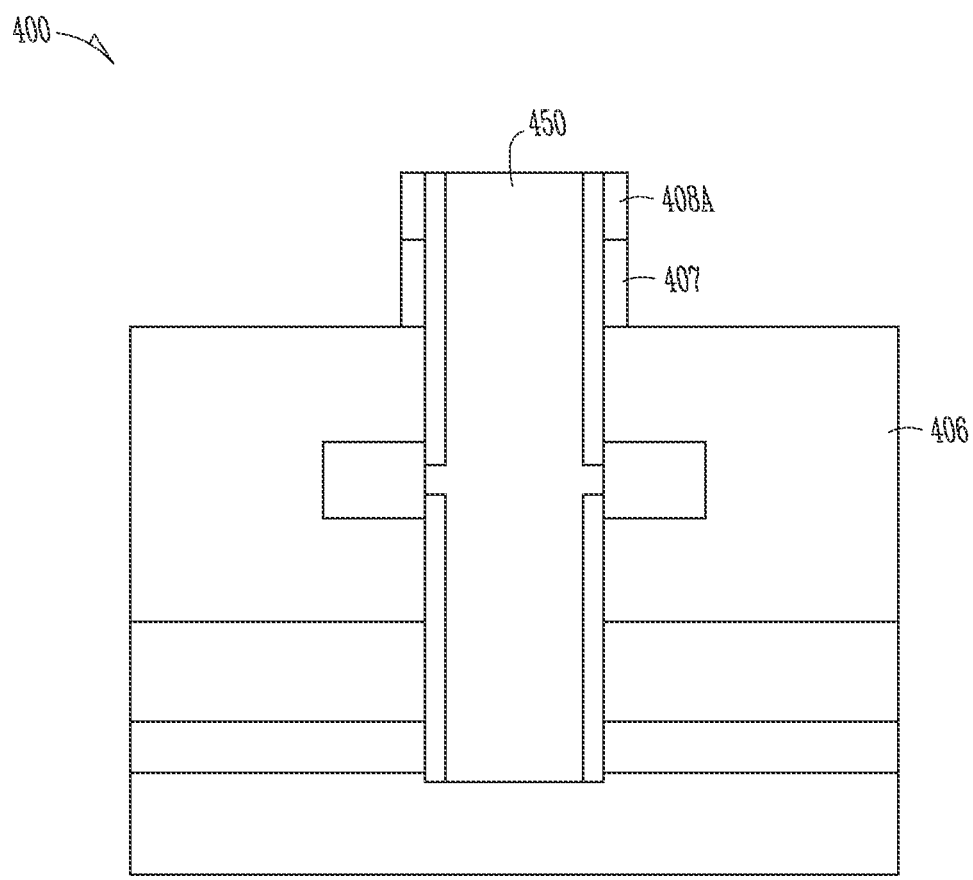

Referring to FIG. 4G, in some embodiments, with the mask 470 on the planarized top surfaces of the opening 450 and the spacers 408A, the entire protection layer 460 of MLR and portions of the tier of polysilicon 407 may be selectively etched by downward etching.

Figure 4H:
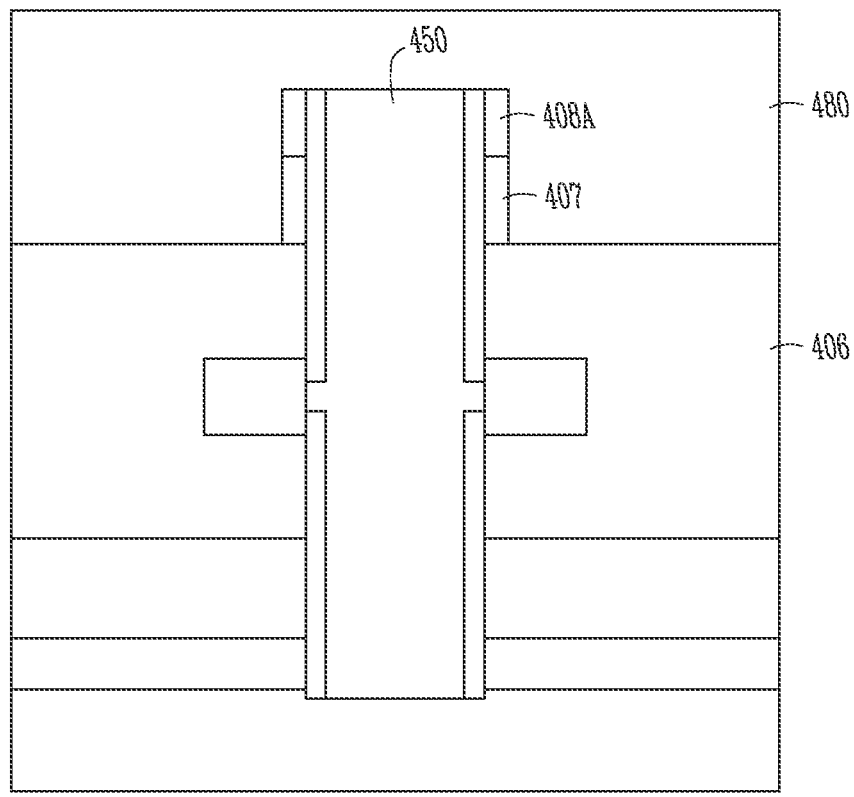

Referring to FIG. 4H, in some embodiments, a filler 480 of oxide may be filled to cover the tier stack 406, the spacers 408A, the tier of polysilicon 407, and the opening 450.

While a number of embodiments are described herein, these are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the disclosure. It is to be understood that the above description is intended to be illustrative and not restrictive. Combinations of the above embodiments, and other embodiments, will be apparent to those of skill in the art upon studying the above description.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A semiconductor device, comprising:
   a stack structure comprising:
     a source,
     an etch stop over the source, the etch stop comprising:
       a first etch stop level including nitride over the source, and
       a second etch stop level including oxide over the first etch stop level, a select gate source level over the etch stop,
     a charge storage structure over the select gate source level, and
     an opening extending vertically into the stack structure to a level adjacent the source; and
   a channel comprising polysilicon formed on a side surface and a bottom surface of the opening, the channel contacting the source at a lower portion of the opening.

2. The semiconductor device of claim 1, wherein the channel is laterally separated from the charge storage structure by a tunnel dielectric.

3. The semiconductor device of claim 1, wherein the stack structure further comprises a select gate drain level over the charge storage structure.

4. The semiconductor device of claim 3, wherein the stack structure further comprises a cap comprising nitride formed over the select gate drain level.

5. The semiconductor device of claim 3, wherein the select gate source level comprises polysilicon, a control gate comprises polysilicon, with the control gate formed over the select gate source level, and the select gate drain level comprises polysilicon.

6. A method of forming a semiconductor device, comprising:
   forming a stack structure, the stack structure comprising:
     a source,
     a select gate source level over the source,
     a control gate level over the select gate source level, and
     a select gate drain level over the control gate level;
   forming an opening extending vertically into the stack structure;
   laterally etching surfaces of the opening to form a recess into the control gate level;
   forming an interpoly dielectric over a bottom surface and a side surface of the opening;
   forming a charge storage structure in the recess;
   forming a channel material comprising polysilicon on the bottom surface and the side surface of the opening; and
   forming a conductive plug extending into the channel material to a level adjacent to the charge storage structure.

7. The method of claim 6, wherein the opening vertically extends through the select gate drain level, the select gate source level, and the control gate level of the stack structure.

8. The method of claim 6, wherein a first width of the opening adjacent the charge storage structure is substantially the same as a second width of the opening adjacent the select gate drain level.

9. The method of claim 6, further comprising:
   removing a filler comprising oxide from an upper portion of the opening to the level adjacent to the charge storage structure, and forming the plug comprising polysilicon in an upper portion of the channel material.

10. The method of claim 6, further comprising forming a dielectric etch stop over the source, the dielectric etch stop comprising an oxide material.

11. The method of claim 6, wherein the method includes doping each of the select gate source level, the control gate level, and the select gate drain level by performing doping configurations different for each of the select gate source level, the control gate level, and the select gate drain level.

12. The method of claim 11, wherein doping the select gate source level and doping the select gate drain level includes using the same dopant under different processing for the select gate source level and the select gate drain level.

13. The method of claim 12, wherein doping the control gate level includes doping the control gate level with a dopant different from doping the select gate source level and doping the select gate drain level.

14. A method of forming a semiconductor device, comprising:
   forming a stack structure, the stack structure comprising:
      a source,
      a first etch stop level comprising nitride over the source,
      a second etch stop level comprising oxide on the first etch stop level,
      a select gate source level over the second etch stop level, and
      a control gate level over the select gate source level,
   forming an opening to extend vertically into the stack structure to expose the first etch stop level;
   laterally etching the opening to form a recess into the control gate level;
   forming an interpoly dielectric on a bottom surface and a side surface of the opening;
   forming a charge storage structure in the recess; and
   forming a channel on the bottom surface and the side surface of the opening.

15. The method of claim 14, further comprising forming a plug comprising polysilicon in an upper portion of the opening to extend vertically from a top surface of the opening to a level adjacent to the charge storage structure.

16. The method of claim 14, wherein the stack structure further comprises a select gate drain level over the control gate level.

17. The method of claim 16, wherein a first width of the opening adjacent the charge storage structure is substantially the same as a second width of the opening adjacent the select gate drain level.

18. The method of claim 16, further comprising forming a plug comprising polysilicon in an upper portion of the opening to extend vertically from a top surface of the opening to a level adjacent to the select gate drain level.

19. The method of claim 16, wherein the method includes doping each of the select gate source level, the control gate level, and the select gate drain level by performing doping configurations different for each of the select gate source level, the control gate level, and the select gate drain level.

20. The method of claim 16, wherein the method includes:
   using different doping configurations for the select gate source level, the control gate level, and the select gate drain level; and
   performing selective etchings of the select gate source level, the control gate level, and the select gate drain level, forming different laterally recessed depths relative to an original dimension of the opening.

* * * * *